US012804923B2

(12) United States Patent
Chan

(10) Patent No.: US 12,804,923 B2
(45) Date of Patent: Nov. 17, 2026

(54) TRENCH MOSFET DEVICE WITH PROTECTION GATE STRUCTURE AND A METHOD OF MANUFACTURING THE SAME

(71) Applicant: Unity Power Technology Limited, Kowloon (HK)

(72) Inventor: Wai Tien Chan, Tai Wai (HK)

(73) Assignee: Unity Power Technology Limited, Kowloon (HK)

( * ) Notice: Subject to any disclaimer, the term of this patent is extended or adjusted under 35 U.S.C. 154(b) by 456 days.

(21) Appl. No.: 18/237,034

(22) Filed: Aug. 23, 2023

(65) Prior Publication Data

US 2025/0072021 A1 Feb. 27, 2025

(51) Int. Cl.

*H10D 12/01* (2025.01)
*H10D 30/66* (2025.01)
*H10D 62/10* (2025.01)
*H10D 62/832* (2025.01)

(52) U.S. Cl.

CPC ......... *H10D 12/031* (2025.01); *H10D 30/668* (2025.01); *H10D 62/10* (2025.01); *H10D 62/127* (2025.01); *H10D 62/8325* (2025.01)

(58) Field of Classification Search

CPC .... H10D 12/031; H10D 30/668; H10D 62/10; H10D 62/127; H10D 62/8325; H10D 30/0297; H10D 62/107; H10D 84/141

See application file for complete search history.

(56) References Cited

U.S. PATENT DOCUMENTS

| | | | | |
|---|---|---|---|---|
| 10,580,878 B1 | 3/2020 | Joshi et al. | | |
| 10,784,338 B2 | 9/2020 | Cheng et al. | | |
| 2019/0081170 A1* | 3/2019 | Kumagai | ............. | H10D 84/035 |
| 2023/0026868 A1* | 1/2023 | Ji | .......................... | H10D 64/519 |
| 2025/0072044 A1* | 2/2025 | Kim | ..................... | H10D 12/031 |

OTHER PUBLICATIONS

Takaya, H. et al., "4H-SiC Trench MOSFET with Thick Bottom Oxide", Materials Science Forum vols. 740-742 (2013), pp. 683-686.

Zhang, M. et al., "SiC trench MOSFET with self-biasted p-shield for low R ON-SP and low OFF-state oxide field", The Institution of Engineering and Technology, Apr. 27, 2017, pp. 1208-1213.

* cited by examiner

*Primary Examiner* — Steven B Gauthier
*Assistant Examiner* — Alvin L Lee
(74) *Attorney, Agent, or Firm* — Warner Norcross + Judd LLP

(57) ABSTRACT

A silicon carbide MOSFET device which contains a N-Channel MOSFET, and a JFET connected to the N-Channel MOSFET such that their drain-source current paths are connected in series. A gate of the JFET is connected to a gate of the N-Channel MOSFET device via a voltage divider, which is formed monolithically with the silicon carbide substrate and the first to fourth silicon carbide layers. The protection gate structure can shield the trench oxide from high drain voltage during off-state. The voltage divider is configured to restrict a gate voltage of the JFET such that a SiC PN diode formed within the silicon carbide MOSFET device is turned off when the N-Channel MOSFET is on or off.

16 Claims, 40 Drawing Sheets

TRENCH MOSFET DEVICE WITH PROTECTION GATE STRUCTURE AND A METHOD OF MANUFACTURING THE SAME

FIELD OF INVENTION

This invention relates to semiconductor devices, and in particular to silicon carbide MOSFETs.

BACKGROUND OF INVENTION

Silicon Carbide (SiC) is a wide-bandgap semiconductor with superior characteristics than silicon and considered as next generation materials for power devices. The critical electric field of SiC is ten times higher than that of silicon, which results in much thinner drift region to achieve high voltage application. Moreover, thermal conductivity of SiC is three times higher than that of silicon, which allows the device to operate at high temperature and high current density without catastrophic failure.

However, conventionally there is a downside of silicon carbide which is the high interface state density in $SiC/SiO_2$ layers, which leads to low channel mobility and high on-resistance. Although SiC Trench MOSFET provide much higher channel mobility and smaller cell size than a planar MOSFET, the bottom of the trench always suffers from high oxide field as the gate oxide is exposed, which suffers from high voltage shock when the MOSFET is reversed. This oxide field can be as high as 7 MV/cm for a 1200V Trench MOSFET, which far exceeds the safety level of 3 MV/cm, and lead to premature breakdown or long-term reliability problem.

In the art there have been some attempts to reduce electric field and protect the bottom region of the trench oxide, such as configuring a thick bottom oxide to reduce electric field at bottom of the trench, creating a P− shield region at the trench bottom and connect it to a self-biased circuit, configuring a side P− shield region, and creating extra buried wells for protection. However, all these conventional techniques are associated with certain shortcomings. For example, using the thick bottom oxide alone results in a very low efficiency of the SiC MOSFET, and at the same time the sidewall gate oxide that is exposed is still vulnerable to the strong oxide field. Using the self-biasing circuit means there are extra diodes and capacitance required, which will greatly deteriorate the response time of the device. Use a side P− shield region may help with reducing junction field effect transistor (JFET) resistance but it scarifies cell area for transistor channels. Lastly, using extra buried wells for protection occupies extra cell area, and the buried wells form parasitic JFETs which create significant resistance during on-state and increase the resultant on-resistance of the trench MOSFET.

SUMMARY OF INVENTION

In the light of the foregoing background, it is an object of the present invention to focuses on the above-mentioned weakness and propose alternative SiC MOSFET devices to provide better protection to the gate oxide of these devices.

The above object is met by the combination of features of the main claim; the sub-claims disclose further advantageous embodiments of the invention.

One skilled in the art will derive from the following description other objects of the invention. Therefore, the foregoing statements of object are not exhaustive and serve merely to illustrate some of the many objects of the present invention.

Accordingly, the present invention, in one aspect is a silicon carbide MOSFET device which contains a N-Channel MOSFET, and a JFET connected to the N-Channel MOSFET such that their drain-source current paths are connected in series. A gate of the JFET is connected to a gate of the N-Channel MOSFET device via a voltage divider.

In some embodiments, a drain of the JFET is configured as a drain of the silicon carbide MOSFET device, and a source of the N-Channel MOSFET is configured as a source of the silicon carbide MOSFET device. A source of the JFET is connected to a drain of the N-Channel MOSFET.

In some embodiments, the voltage divider includes a resistor network.

In some embodiments, the voltage divider is configured to restrict a gate voltage of the JFET such that a SiC PN diode formed within the silicon carbide MOSFET device is turned off when the N-Channel MOSFET is on or off.

In some embodiments, a gate resistor is connected between the gate of the silicon carbide MOSFET device, and the gate of the N-Channel MOSFET. The gate resistor is configured to control a switching speed of the N-Channel MOSFET.

According to another aspect of the invention, there is provided a silicon carbide MOSFET device, which contains a silicon carbide substrate of a first dopant type, a first silicon carbide layer of the first dopant type on top of the silicon carbide substrate, a plurality of trenches partially formed in the first silicon carbide layer where each of the plurality of trenches is covered with an gate oxide, a second silicon carbide layer of a second dopant type embedded in the first silicon carbide layer where the second silicon carbide layer includes a plurality of second portions, a third silicon carbide layer of the second dopant type located above at least part of the second silicon carbide layer, and a fourth silicon carbide layer above at least part of the third silicon carbide layer. The gate oxide of each of the plurality of trenches contains a bottom surface and a side surface. A corresponding one of the plurality of second portions is located directly underneath the bottom surface of the gate oxide of each of the plurality of trenches. The silicon carbide MOSFET device further contains a plurality of resistors that are formed monolithically with the silicon carbide substrate and the first to fourth silicon carbide layers.

In some embodiments, the first dopant type is N and the second dopant type is P. The second and third silicon carbide layers are P− layers, and the fourth silicon carbide layer includes N+ regions and P+ regions.

In some embodiments, the corresponding one of the plurality of second portions does not cover the side surface of the gate oxide of each of the plurality of trenches.

In some embodiments, the plurality of resistors is offset from the plurality of trenches along a horizontal direction.

In some embodiments, the plurality of resistors is located above the fourth silicon carbide layer.

In some embodiments, the plurality of resistors contains a first resistor and a second resistor. The first resistor and the second resistor are both connected to the plurality of second portions.

In some embodiments, the first and second resistors constitute a voltage divider.

In some embodiments, the first resistor is electrically connected to a source electrode of the silicon carbide MOSFET device.

In some embodiments, the plurality of resistors contains a third resistor, which connects a polysilicon in each of the plurality of the trenches to a gate electrode of the silicon carbide MOSFET device.

In some embodiments, the gate electrode is offset horizontally from a source electrode of the silicon carbide MOSFET device.

In some embodiments, the silicon carbide MOSFET device further contains a field oxide layer on top of the fourth silicon carbide layer. The field oxide layer contains a plurality of oxide portions each formed above and corresponding to one of the plurality of trenches.

In some embodiments, the silicon carbide MOSFET device further contains a dielectric layer substantially on top of the field oxide layer. The dielectric layer contains a plurality of dielectric insulating portions each formed above and corresponding to one of the oxide portions.

According to a further aspect of the invention, there is provided a method of producing a silicon carbide MOSFET device, which contains the step of providing a first silicon carbide layer of a first dopant type on top of a silicon carbide substrate, forming a plurality of trenches which is partially embedded in the first silicon carbide layer where each of the plurality of trenches is covered with an gate oxide; providing a second silicon carbide layer of a second dopant type embedded in the first silicon carbide layer where the second silicon carbide layer contains a plurality of second portions; providing a third silicon carbide layer of the second dopant type located above at least part of the second silicon carbide layer; providing a fourth silicon carbide layer above at least part of the third silicon carbide layer; and forming a plurality of resistors monolithically with the silicon carbide substrate and the first to fourth silicon carbide layers. The gate oxide of each of the plurality of trenches contains a bottom surface and a side surface. A corresponding one of the plurality of second portions is located directly underneath the bottom surface of the gate oxide of each of the plurality of trenches.

In some embodiments, the first dopant type is N and the second dopant type is P. The second and third silicon carbide layers are P− layers. The fourth silicon carbide layer includes P+ regions and N+ regions.

In some embodiments, the step of providing a second silicon carbide layer further contains the steps of: forming a plurality of first trenches in the first silicon carbide layer; performing epitaxy of the second dopant type over the first silicon carbide layer including the plurality of first trenches to obtain the second silicon carbide layer; and patterning and etching the second silicon carbide layer at predetermined positions to form the plurality of second portions.

In some embodiments, the step of forming the plurality of resistors further includes the steps of: providing a polysilicon layer over the fourth silicon carbide layer; implanting the polysilicon layer with the first dopant type to trim the resistivity of resistors; and patterning and etching the polysilicon layer to form a first resistor and a second resistor.

In some embodiments, the first and second resistors constitute a voltage divider.

In some embodiments, the first resistor is electrically connected to a source electrode of the silicon carbide MOSFET device.

In some embodiments, the step of forming the plurality of resistors further includes providing a polysilicon layer over the fourth silicon carbide layer; doping at least a part of the polysilicon layer with dopants of the first dopant type; and patterning and etching the polysilicon layer to form a third resistor.

In some embodiments, the third resistor connects a polysilicon in each of the plurality of the trenches to a gate electrode of the silicon carbide MOSFET device.

Embodiments of the invention therefore provide SiC MOSFET structures with increased ruggedness of the MOSFET device, but without compromising the relatively small area of the MOSFET cell that is used. For example, in some embodiments of the invention the P− shield region is located at bottom of trench gate which does not scarify half the transistor channel, nor does it require any extra area of buried well. The protection gate structure can shield the trench oxide from high drain voltage during off-state, for example by utilizing the JFET region to make sure any SiC PN diode formed by P− shield region and N− drift region is always turned off. The JFET region widens current path in JFET region during on-state, so that one can obtain lower on-resistance compared to conventional P− shield structures. In some embodiments, the SiC MOSFET device can be manufactured on a monolithic SiC chip without external components.

BRIEF DESCRIPTION OF FIGURES

The foregoing and further features of the present invention will be apparent from the following description of preferred embodiments which are provided by way of example only in connection with the accompanying figures, of which:

FIG. 4*a* shows one specific example of gate voltages applied to the JFET and N-MOSFET in the device of FIG. 2, when the device is turned on.

In the drawings, like numerals indicate like parts throughout the several embodiments described herein.

DETAILED DESCRIPTION OF THE PREFERRED EMBODIMENTS

In the claims which follow and in the preceding description of the invention, except where the context requires otherwise due to express language or necessary implication, the word "comprise" or variations such as "comprises" or "comprising" is used in an inclusive sense, i.e., to specify the presence of the stated features but not to preclude the presence or addition of further features in various embodiments of the invention.

As used herein and in the claims, "couple" or "connect" refers to electrical coupling or connection either directly or indirectly via one or more electrical means unless otherwise stated.

Terms such as "horizontal", "vertical", "upwards", "downwards", "above", "below" and similar terms as used herein are for the purpose of describing the invention in its normal in-use orientation and are not intended to limit the invention to any particular orientation.

When describing the silicon carbide structures of any MOSFET device the terms "region" and "portion" are used interchangeably since a region in the MOSFET device that is made of a particular material different that of its surrounding part could also be said to be a portion of made of the particular material.

Figure 1:
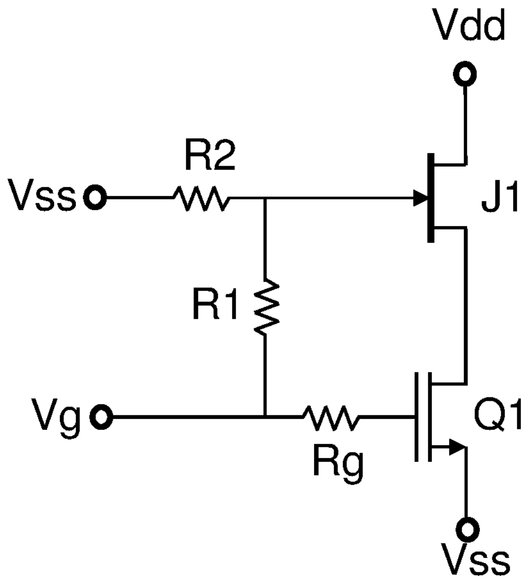
FIG. 1 shows the equivalent circuit diagram of a SiC MOSFET device according to a first embodiment of the invention.

Referring now to FIG. 1, the first embodiment of the present invention is a SiC MOSFET device, of which an equivalent circuit is shown in FIG. 1. Note that the actual cell layout of the SiC MOSFET device (e.g., with silicon carbide layers) is not shown, and those skilled in the art should understand that the circuit shown in FIG. 1 could correspond to many different SiC MOSFET structures (examples of which will be described later) within the spirit of the invention. The SiC MOSFET device contains a JFET J1 and a N-Channel MOSFET Q1, which are connected in series. In other words, the drain-source current path of the JFET J1 is connected in series with that of the N-Channel MOSFET Q1. As shown in FIG. 1, the source of the JFET J1 is connected to the drain of the N-Channel MOSFET Q1, the drain of the JFET J1 connected to the drain of the whole SiC MOSFET device (indicated by the pin at which Vdd is present), and the source of the N-Channel MOSFET Q1 connected to the source of the whole SiC MOSFET device (indicated by the pin at which Vss is present). On the other hand, both the gate of the JFET J1 and the gate of the N-Channel MOSFET Q1 connect to the gate of the whole SiC MOSFET device (indicated by the pin at which Vg is present). However, between the gate of JFET J1 and the gate of the whole SiC MOSFET device there is connected a voltage divider in the form of a resistor network, and between the gate of N-Channel MOSFET Q1 and the gate of the whole SiC MOSFET device there is connected a gate resistor Rg. The resistor network includes two resistors R1, R2 connected in series, while the gate of the JFET J1 is connected between resistor R1 and resistor R2. Another end of the resistor R2 is connected to the source of the N-Channel MOSFET Q1 (and thus the source of the whole SiC MOSFET device). Both the resistor R1 and the resistor Rg connect to the gate of the whole SiC MOSFET device.

Figure 2:
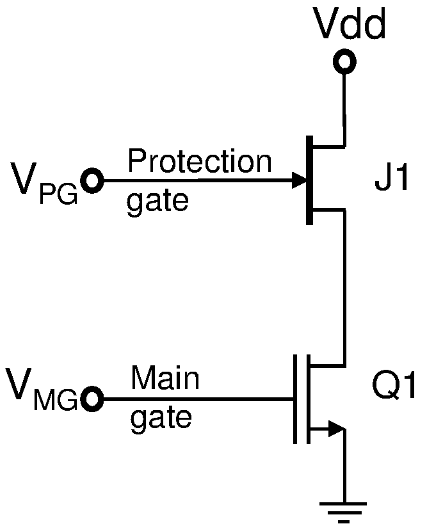
FIG. 2 shows a simplified circuit layout of the circuit diagram of FIG. 1.

FIG. 2 shows a simplified circuit diagram of the circuit in FIG. 1, as the voltage divider is omitted, and the gate voltages of the JFET J1 and the N-Channel MOSFET Q1 are represented by $V_{PG}$ and $V_{MG}$ respectively in FIG. 2. Based on the circuit diagram in FIG. 1, one can see that $V_{MG}$ equals to the voltage applied to the gate of the whole SiC MOSFET device (which is $V_g$ in FIG. 1), while $V_{PG}$ is determined by the voltage dividing ratio of the voltage divider. By choosing appropriate values of R1 and R2, a desired $V_{PG}$ can be supplied. In one preferred implementation, a ratio of 5:1 exists for the values of R1 and R2, for example the resistances of R1 and R2 could be 25 MΩ are 5 MΩ respectively.

The gate of the N-Channel MOSFET Q1 is called a main gate in this embodiment, and the gate of the JFET J1 is called a protection gate, since the N-Channel MOSFET Q1 is the primary component in fulfilling functions of the SiC MOSFET device, and the JFET J1 is utilized as a protection device of gate oxide of the N-Channel MOSFET Q1. Also, in the simplified circuit diagram of FIG. 2 it is defined that the source of the N-Channel MOSFET Q1 is connected to ground (thus Vss=0V).

Figure 3:
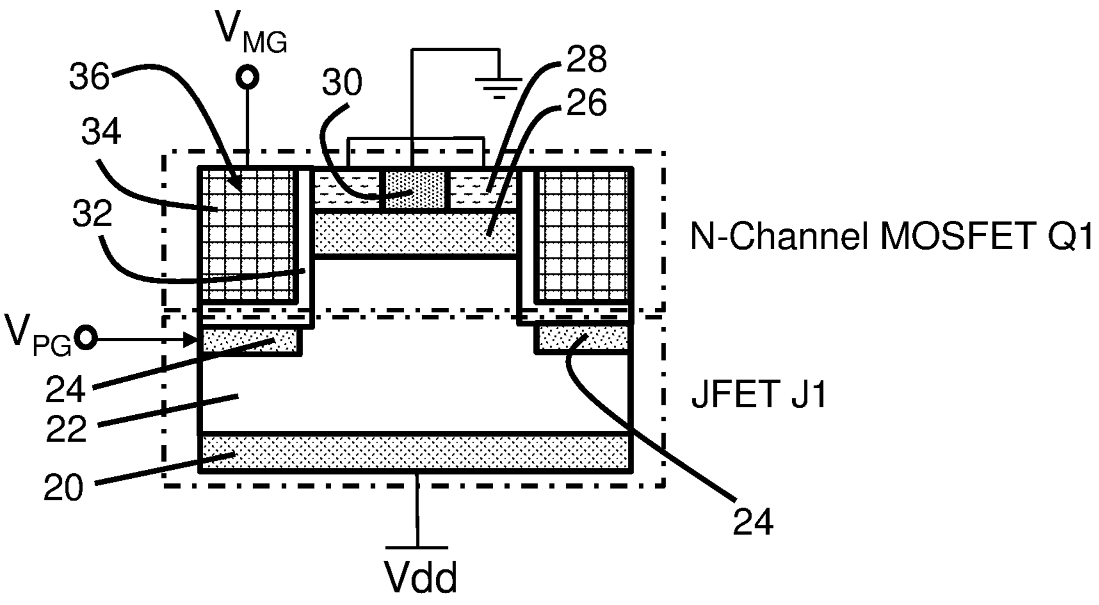
FIG. 3 depicts a simplified cross-sectional structure diagram of a SiC MOSFET device according to a second embodiment of the invention, which can be represented by the circuit layouts in FIGS. 1-2.

The working principle of the circuit shown in FIG. 1 will now be described with reference to an exemplary SiC MOSFET device which has a simplified cross-sectional structure diagram as shown in FIG. 3. Note that the device structure in FIG. 1 is not intended to be limiting, but one should realize that there are many other possible SiC MOSFET devices which have different structures but which can be applied with the circuit layouts in FIG. 1 and/or FIG. 2. For the ease of discussion, the above-mentioned 5:1 ratio between R1 and R2 is adopted in an example, and assume that the maximum gate voltage $V_g$ of the SiC MOSFET device is 15V, then because of the 5:1 ratio the range of variation of $V_{MG}$ is 0-15V, but the range of variation of $V_{PG}$ is 0-2.5V. The above-mentioned resistances of R1 and R2 which are 25 MΩ and 5 MΩ respectively are also used in this example, and the resistances of R1 and R2 are high enough to limit the gate current of the whole SiC MOSFET device. With a maximum gate voltage $V_g$ of 15V, the maximum gate current with the above resistor values is limited to be 500 nA at 15V gate drive.

In this example, the gate voltage $V_{PG}$ to the JFET J1 is configured to be lower than the turn-on voltage of a SiC PN diode formed by the P− shield regions 24 and the N− drift region 22 in the SiC MOSFET device (see FIG. 3), which is generally in the range of 2.7V to 3V. When the N-Channel MOSFET Q1 is at off-state, the electric potential of the N− drift region 22 will be between the source region (denoted by the P+ region 30 and the N+ regions 28) and the drain region (defined by the silicon substrate 20), say 50V. The P− shield regions 24 which connects to the gate of the JFET J1 is at 0V now. This keeps the SiC PN diode at its off-state, as otherwise if the SiC PN diode is turned on there will be a leakage of current. On the other hand, when the N-Channel MOSFET Q1 is at on-state, the drain to source voltage Vds drops and this leads to the electric potential of N− drift region 22 dropping to almost 0V. The P− shield regions 24, which connect to the gate of the JFET J1, is at 2.5V now. This keeps the SiC PN diode remaining in the off-state. Therefore, no matter whether the N-Channel MOSFET Q1 is turned on or off, the SiC PN diode is always off. One can see that by limiting the gate voltage of the JFET J1 (which limited to be no more than 2.5V in this example), the potential difference between P− shield regions 24 and the N− drift region 22 is kept below the turn-on voltage of SiC PN diode. Compared to prior art, the SiC MOSFET device described above not only has the on-state of the N-Channel MOSFET Q1 protected, but the off-state is also protected.

On the other hand, the gate resistor Rg in FIG. 1 is used to control the switching speed of the N-Channel MOSFET Q1 to minimize the instantaneous gate voltage pulse during switching. Even this instantaneous pulse causes hole injection of the SiC PN diode, the holes can be quickly collected by the P− base region 26 of the N-Channel MOSFET Q1 or recombine with electrons in N− drift region 22. The value of the resistor Rg could be either small or even close to zero, or be very large, as it is chosen depending on actual circuit designs.

Note that the various resistors R1, R2 and Rg are not shown in the simplified structure in FIG. 3. Nonetheless, FIG. 3 shows the stack structure of various silicon carbide layers, and the N− drift region 22 is stacked on top of the silicon substrate 20. There is a plurality of trenches 36 in the device and each trench 36 is filled with gate polysilicon 34, and at the exterior of the trenches 36 there is a gate oxide 32 which has a bottom surface and a side surface. The P− shield regions 24 are each located directly underneath the bottom surface of each of the trenches 36. The P− shield regions 24 also serve as the gate of the JFET J1, to which the gate voltage $V_{PG}$ is applied to. Part of each trench 36 is embedded in the N− drift region 22, and the P− shield regions 24 are embedded in the N− drift region 22. On top of the N− drift region 22 and between the trenches 36, there is the P− base region 26, and on top of the P− base region 26 there is the P+ region 30 which is located between the two N+ portions 28. The silicon substrate 20 defines the drain region of the SiC MOSFET device (which also is the drain region for the JFET J1). The P+ regions 30 and the N+ portions 28 define the source region of the SiC MOSFET device (which also is the source region for the N-Channel MOSTFET Q1). Just as in FIG. 2, the source region is shown to be grounded. The top portion of the gate polysilicon 34 in the trenches 36 defines the gate region of the SiC MOSFET device (which also is the gate region for the N-Channel MOSTFET Q1).

Figure 4A:
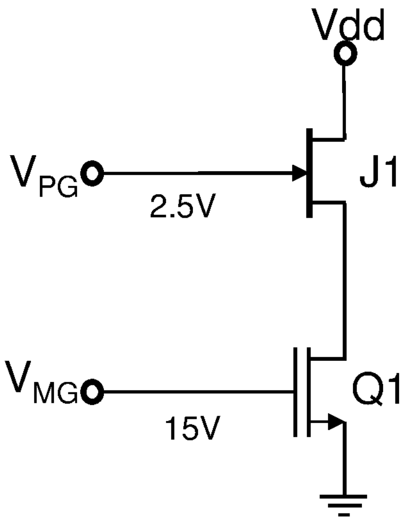
Figure 4B:
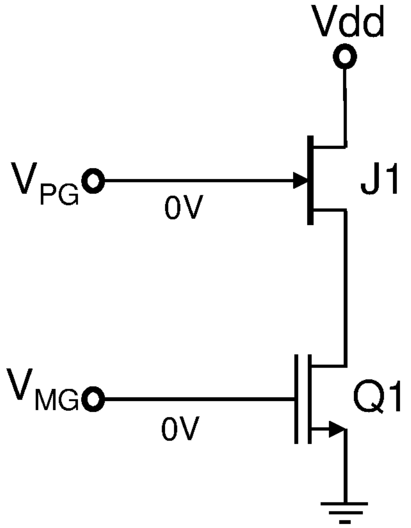
FIG. 4*b* shows another specific example of gate voltages applied to the JFET and N-MOSFET in the device of FIG. 2, when the device is turned off.
Figure 5A:
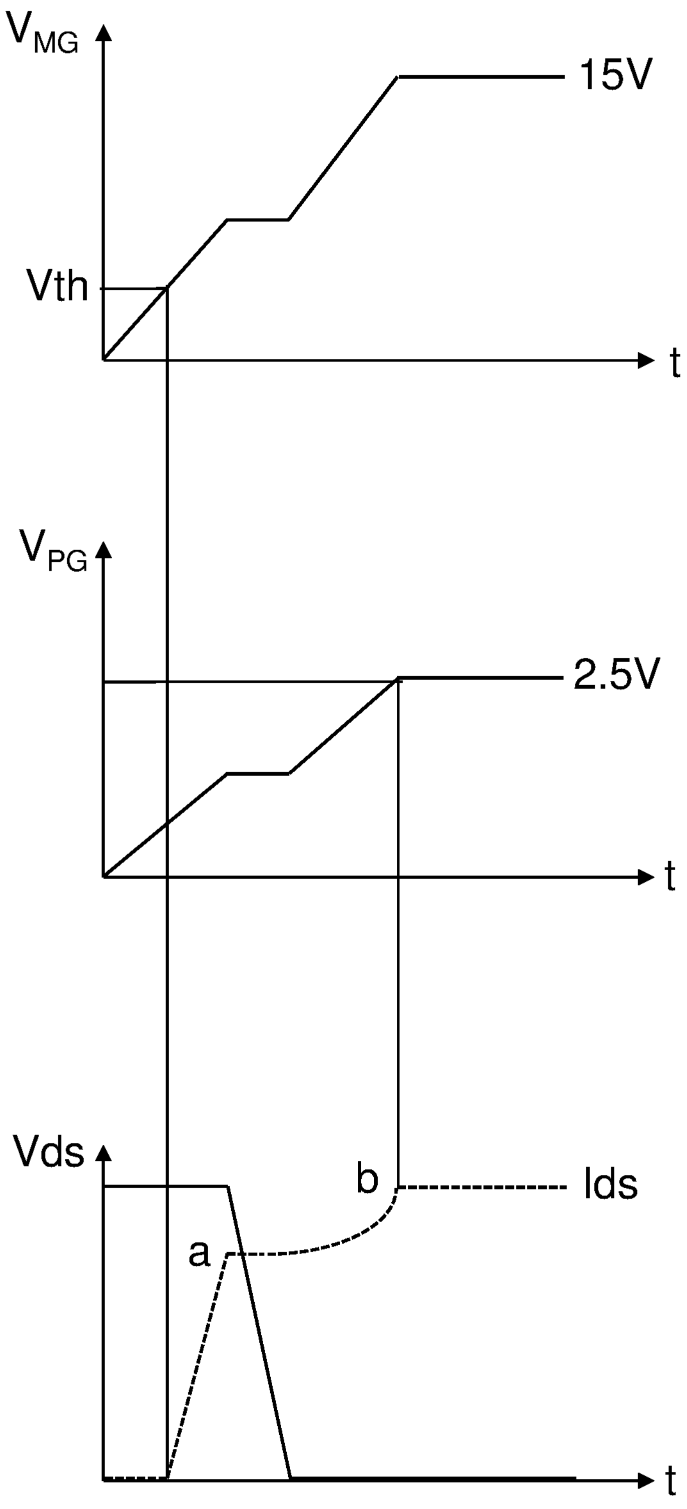
FIG. 5*a* shows variations of $V_{MG}$, $V_{PG}$ and Vds over time when the SiC MOSFET device is being turned on in the example of FIG. 4*a*.

Next, with reference to FIGS. 4*a*-5*b*, the circuit behavior of the exemplary SiC MOSFET device in FIG. 3 will be described using the example setting of resistor values and gate voltages mentioned above. When the SiC MOSFET device is to be turned on, as shown in FIG. 5*a*, the gate voltage $V_g$ ramps up from 0V to 15V. The main gate voltage $V_{MG}$ will follow the $V_g$ signal to go up from 0V to 15V, while the protection gate voltage $V_{PG}$ is driven by the voltage divider to increase from 0V to 2.5V (given the 5:1 R1 to R2 ratio of this voltage divider). When $V_{MG}$ is above a threshold voltage $V_{th}$ as shown in FIG. 5*a*, the N-Channel MOSFET Q1 is turned on, and the drain current Ids starts to increase. Due to the depletion of JFET J1 caused by the two adjacent P− shield regions 24 (as shown in FIG. 3), however, Ids is limited to Level a as shown in FIG. 5*a*. Nonetheless, as time goes by when $V_{PG}$ continues to rise together with $V_{MG}$, the depletion of JFET J1 starts shrinking, resulting in a wider conduction path of the N-Channel MOSFET between the two adjacent P− shield regions 24. As a result, Ids starts raising again beyond Level a in FIG. 5*a*. When $V_{MG}$ reaches 15V and $V_{PG}$ reaches 2.5V (as shown in FIG. 4*a*), the channel of JFET J1 is at its maximum width so that the Ids is saturated at Level b. One can see that the SiC MOSFET device can achieve a higher saturation current than conventional art, and thus the performance of the SiC MOSFET device is improved.

Figure 5B:
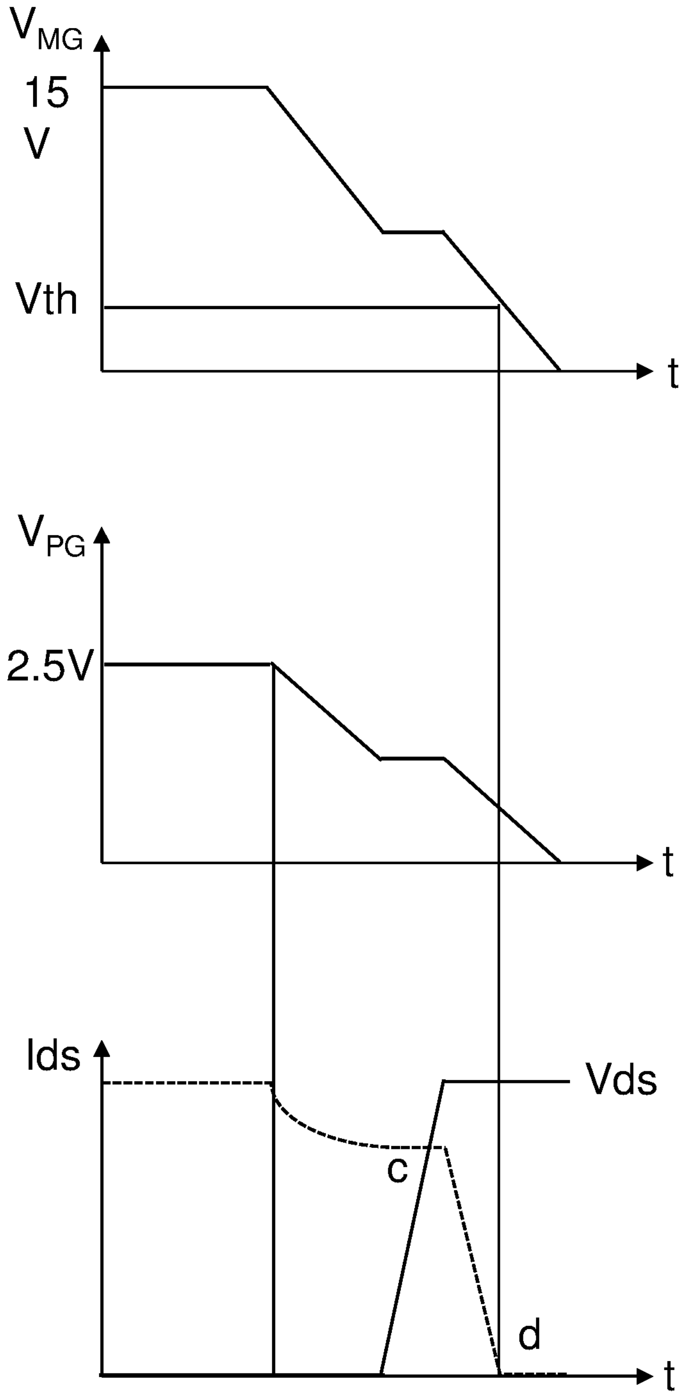
FIG. 5*b* shows variations of $V_{MG}$, $V_{PG}$ and Ids over time when the SiC MOSFET device is being turned off in the example of FIG. 4*b*.

On the other hand, when the SiC MOSFET device is to be turned off, the gate voltage $V_g$ ramps down from 15V to 0V. $V_{MG}$ will follow the Vg signal to go down from 15V to 0V, while $V_{PG}$ is driven by the voltage divider from 2.5V to 0V (given the 5:1 R1 to R2 ratio of this voltage divider), as shown in FIG. 5*b*. When $V_{PG}$ drops, the depletion of JFET J1 caused by the two adjacent P− shield region 24 will build up to narrow down the conduction path of the N-Channel MOSFET Q1. As a result, Ids starts dropping. When $V_{PG}$ drops to a certain level, the depletion stabilizes, and Ids of the N-Channel MOSFET Q1 drops to Level c. When $V_{MG}$ is below Vth, N-Channel MOSFET Q1 turns off and Ids further drops to Level d, which is at zero current. When both $V_{MG}$ and $V_{PG}$ are 0V (as shown in FIG. 4*b*), the N-Channel MOSFET Q1 is turned off, and the JFET J1 channel is pinched, i.e., the channel thickness goes to zero, there is no further movement of carriers from source to drain, and the current will be practically constant. As such, the depletion of the two adjacent P− shield regions 24 protects the gate oxide 32 of the trenches 36 from the high electric field of drain voltage.

It should be noted that although the gate voltages are reduced to zero in the example mentioned, in variations of the embodiment the gate voltages could also be reduced further to a negative value, if the practical applications require so. For example, the main gate voltage $V_{MG}$ may be reduced to −5V to turn off the N-Channel MOSFET Q1. The negative gate voltage $V_{PG}$ pinches the JFET J1 further and increases the protection to the gate oxide 32 of the trenches 36.

Figure 6:
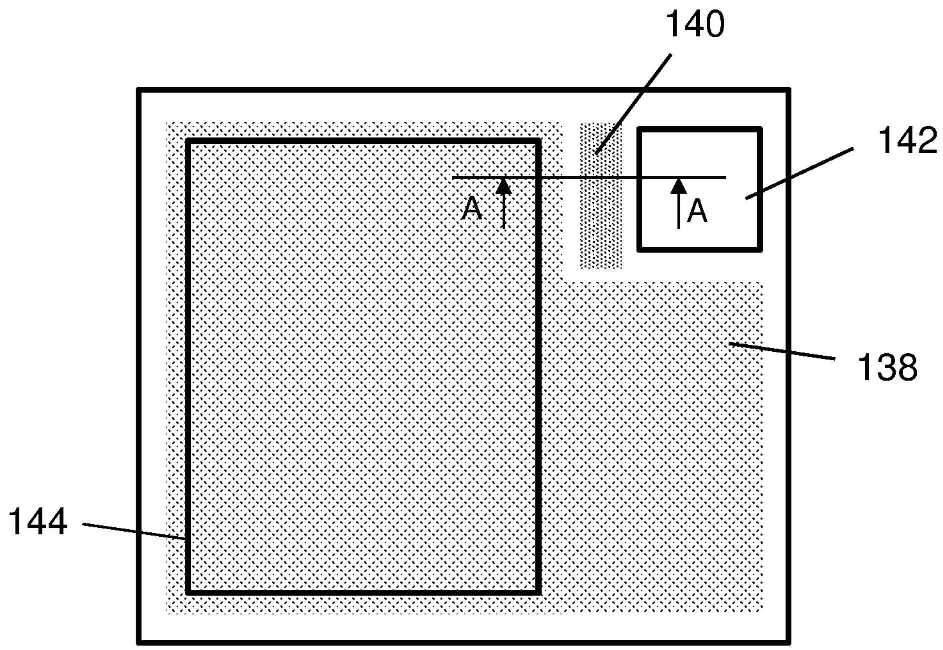
FIG. 6 shows the device layout of a SiC MOSFET device according to a third embodiment of the invention.
Figure 7:
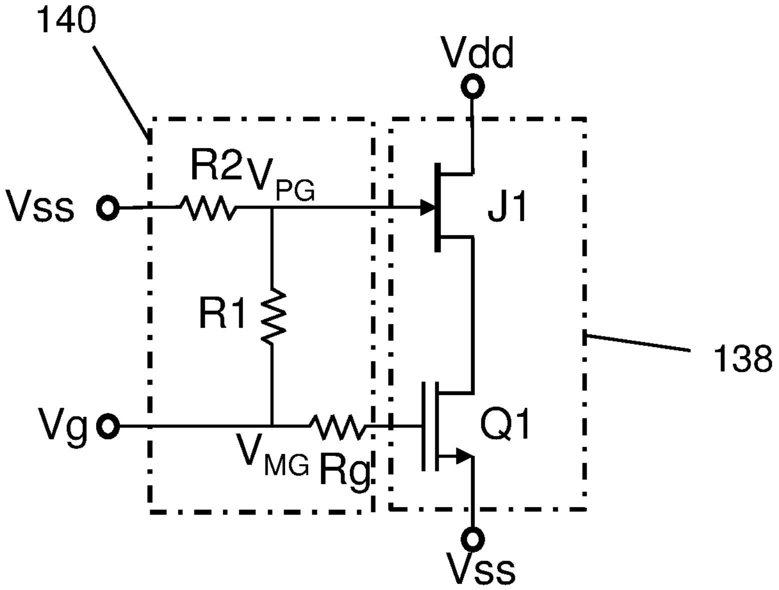
FIG. 7 shows an equivalent circuit diagram of the SiC MOSFET device in FIG. 6.
Figure 8:
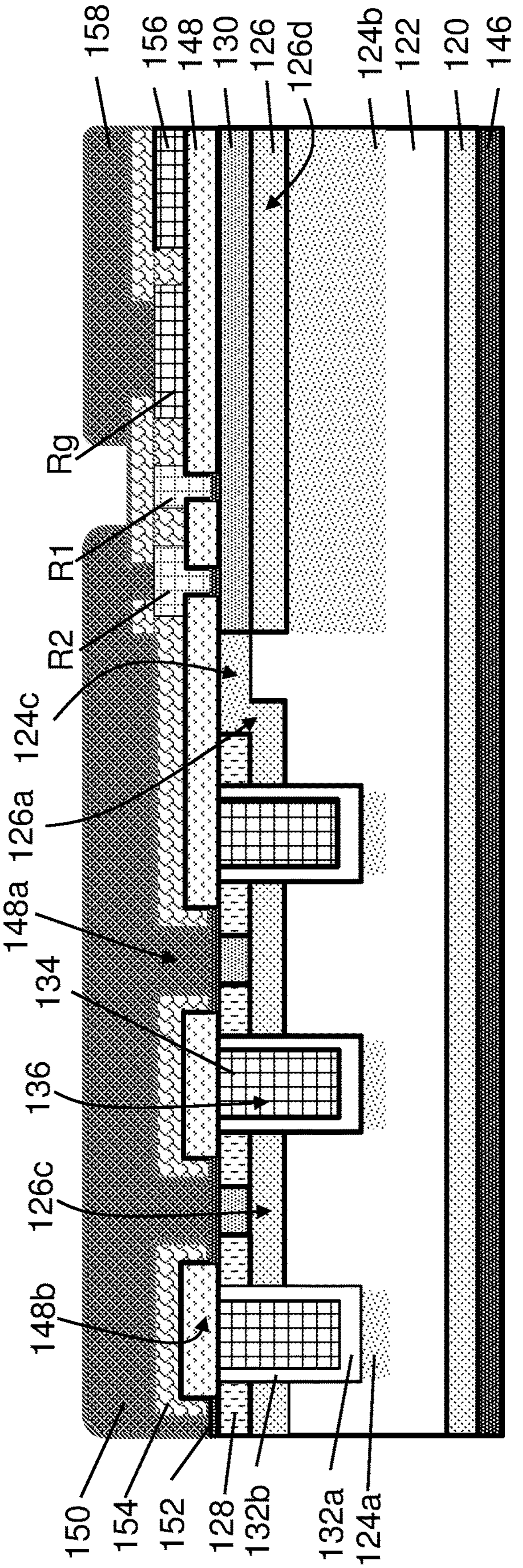
FIG. 8 illustrates the cross-sectional view of the SiC MOSFET device along the line A-A in FIG. 6.

Turning to FIGS. 6-8, a SiC MOSFET device according to another embodiment of the invention will now be described. FIG. 6 shows a top view of the device illustrating the layout, and FIG. 7 shows the schematic circuit of the device. It can be seen that the circuit shown in FIG. 7 is in line with those illustrated in FIGS. 1-2, which proves that the circuits in FIGS. 1-2 can be used as a design guideline to design many different SiC MOSFET devices. Those skilled should understand that what is shown in FIG. 6 is an active cell layout (i.e., a fully functional MOSFET can be formed by extending this active cell to desirable dimension, then surrounded by edge termination).

To explain the layout in FIG. 6, there are illustrated two key components of the SiC MOSFET device in FIG. 6 which are the transistor component and the resistor component.

The transistor component contains a JFET J1 and a N-Channel MOSFET Q1 (not shown in FIG. 6), which are located in a transistor region 138 that takes up most of the area of the device. The resistor component contains resistors R1, R2 and Rg (not shown in FIG. 6), which are located in a resistor region 140 adjacent to a gate pad 142. A source pad 144 is located by the side of the resistor region 140, and one can see that the resistor region 140 is located between the source pad 144 and the gate pad 142. As will be described in more details later, for the SiC MOSFET device in this embodiment a polysilicon layer (which is also used as gate connection) that is doped is used to fabricate the resistors. One should expect these resistors sit on a field oxide located above the SiC surface.

FIG. 8 shows the cross-sectional view of the SiC MOSFET device along the vertical plane through line A-A in FIG. 6. The SiC MOSFET device arranges a source, a gate, and a drain, which make up the silicon pillar vertically (as shown in FIG. 8). In particular, a silicon carbide substrate 120 is configured as the underlying structure and epitaxy of the SiC MOSFET device. As skilled persons would understand the silicon carbide substrate 120 is made from SiC wafers, and in this embodiment the silicon carbide substrate 120 is of N+ type as a first dopant type. The silicon carbide substrate 120 for example can be either a N+ doped 4H—SiC, 3C—SiC or 6H—SiC semiconductor layer, with thickness around 350 μm and resistivity from 0.02 Ω·cm to 0.03 Ω·cm. As skilled persons would understand the silicon carbide substrate 120 will eventually be thinned down to reduce the resistance. There is also a metal layer 146 formed at the bottom side of the silicon carbide substrate 120 as an ohmic contact to be used as the drain contact of the SiC MOSFET device. On top of the silicon carbide substrate 120, there is a first silicon carbide layer 122 of N− type, and the first silicon carbide layer 122 functions as an N− drift layer. The first silicon carbide layer 122 has lower doping than the silicon carbide substrate 120 and they are respectively designated using N− and N+. The first silicon carbide layer 122 is formed by epitaxial process with a thickness for example in the range of 4 μm to 35 μm, and doping concentration in the range of 1e15 $cm^{-3}$ to 3e16 $cm^{-3}$. In one implementation, a 12 μm epitaxy with doping concentration of 1e16 $cm^{-3}$ is used for 1200V SiC Trench MOSFET.

Multiple trenches 136 are formed by etching into the first silicon carbide layer 122, with for example a trench depth in the range of 0.8 μm to 1.6 μm, and a trench width in the range of 0.6 μm to 1.2 μm. In one example, the bottom ends of the trenches 136 are 0.4 μm shallower than the P− shield regions 124*a*. The trenches 136 is each filled with a polysilicon material 134. The trenches 136 are only partially embedded in the first silicon carbide layer 122, near their bottom ends, and the upper part of the trenches 136 passes through a third silicon carbide layer 126 as well as a fourth silicon carbide layer, with the top surface of the trenches 136 flush with a top surface of the fourth silicon carbide layer. Around each of the trenches 136 there is covered a gate oxide of the N-Channel MOSFET Q1 which consists of a bottom gate oxide 132*a* and a sidewall gate oxide 132*b*. The bottom gate oxide 132*a* is equal to or thicker than the sidewall gate oxide 132*b*, depending on how the gate oxide is formed. Common methods for forming the gate oxide include thermal oxidation, HDP-CVD, PE-CVD, and Low Pressure Chemical Vapor Deposition (LP-CVD). The bottom gate oxide 132*a* has thickness in the range of 1000 A to 4000 A. The sidewall gate oxide 132*b* acts to modulate the conductance of the channel of the N-Channel MOSFET Q1. The sidewall gate oxide 132*b* is formed by thermal oxidation, with appropriate post-oxidation annealing to enhance electrical and interface properties. Preferably, the sidewall gate oxide 132*b* has a thickness in the range of 500 A to 2000 A.

Directly underneath each of the bottom gate oxide 132*a*, there is configured a P− shield portion 124*a*, and thus multiple P− shield portions 124*a* shown in FIG. 8 correspond to the multiple trenches 136 respectively. These P− shield regions 124*a* consist of multiple P− shield junctions at each of transistor unit cells and P− shield bus lines (not shown). These P− shield junctions form the gate of the JFET J1 and act to protect the bottom gate oxide 132*a* and the sidewall gate oxide 132*b* of the N-Channel MOSFET Q1. Besides the P− shield regions 124*a*, there is another P− shield region 124*b* horizontally offset from the P− shield regions 124*a*. The P− shield region 124*b* connects each P− shield regions 124*a* through P− shield bus lines (not shown), and is substantially aligned the resistor region and the gate pad of the SiC MOSFET device (not shown, but similar to those shown in FIG. 6). The P− shield portions 124*a*, 124*b* together form a second silicon carbide layer of the SiC MOSFET device. This second silicon carbide layer has a second dopant type P as compared to the first dopant type N of the first silicon carbide layer 122 and the silicon carbide substrate 120. In one example aluminum is used as dopants to form the P− shield regions 124*a*, 124*b*, with doping concentration in the range of 1e17 $cm^{-3}$ to 5e18 $cm^{-3}$.

The third silicon carbide layer 126 is located on top of the P− shield portion 124*b*, although there is a discontinuity within the third silicon carbide layer 126. As shown in FIG. 8, the third silicon carbide layer 126 in the transistor region has multiple P− base regions 126*c* which are separated from each other by the trenches 136, and in each transistor unit cell these P− base regions 126*c* extend laterally (i.e., horizontally) away from P− shield regions 124*a* to form the base regions of the N-Channel MOSFET Q1. The third silicon carbide layer 126 between the resistor region and the transistor region is discontinuous. It terminates at 126*a* in transistor region side and 126*d* in resistor region side. In the resistor region, the third silicon carbide layer 126 contains a P− base region 126*d* that overlaps the P− shield region 124*b* to increase the doping of the junction. The third silicon carbide layer 126 has a second dopant type P, and for example ion implantation with aluminum or boron dopants can be used to form the third silicon carbide layer 126 with a junction depth in range of 0.3 μm to 0.6 μm below the SiC surface, and doping concentration in the range of 5e17 $cm^{-3}$ to 5e18 $cm^{-3}$, typically at 2e18 $cm^{-3}$.

The fourth silicon carbide layer is located substantially above the third silicon carbide layer 126, and the fourth silicon carbide layer contains two types of materials of different conductivity types. Firstly, there are P+ regions 130 of the second conductivity type (P type). In each transistor unit cell, these P+ regions 130 act as body contacts of the N-Channel MOSFET Q1. In the resistor region, the P+ region 130 overlaps to the P− shield region 124*b* to increase the doping of the junction underneath the resistor region so that the ohmic contact can be formed. These P+ regions also run along P− shield bus lines (not shown) to connect multiple P− shield junctions 124*a* of each transistor unit cell to resistors R1 and R2 that will be described later. In one example ion implantation with aluminum or boron dopants can be used to form the P+ regions 130, with a junction depth in the range of 0.2 μm to 0.4 μm, and a doping concentration in the range of 5e19 $cm^{-3}$ to 2e20 $cm^{-3}$. Besides the P+ regions 130, the fourth silicon carbide layer also contains N+ regions 128 of the first conductivity type (N type). In each transistor unit cell, these N+ regions 128 act as source contacts of the N-Channel MOSFET Q1. In one example, ion implantation with nitrogen, or phosphorus dopants can be used to form the N+ regions 128, with a junction depth in the range of 0.2 μm to 0.4 μm, and a doping concentration in the range of 1e20 $cm^{-3}$ to 1.5e20 $cm^{-3}$.

In this embodiment, the top surface of the fourth silicon carbide layer is defined as the SiC surface. On top of the fourth silicon carbide layer there is a field oxide 148 acting as a dielectric layer to insulate each components in the transistor region and resistor region, such as the polysilicon material 134 in the trenches 136 to the P+ regions 130 and N+ regions 128. By patterning and etching field oxide 148 away in particular regions, there are a plurality of oxide portions **148*b* which are formed above and corresponding to one of the plurality of trenches 136. Between the oxide portions 148*b*, contact areas for connection between components below the SiC surface to components above the field oxide 148 are formed. For instance, between two transistor unit cells (each defined by a trench 136) a contact area (indicated by arrow 148*a*) may be formed for a source electrode 150 to connect to a barrier metal 152. In one example, the field oxide 148** is deposited by LP-CVD or PE-CVD, with a thickness in the range of 6000 A to 15000 A.

The barrier metals 152 mentioned above are also formed on top of the fourth silicon carbide layer, and they are at the discontinuities of the field oxide 148. As shown in FIG. 8, between every two adjacent transistor unit cells there is a barrier metal 152 which is in contact with the source electrode 150 that extend downwardly through the contact area, and the barrier metal 152 is also in direct contact with a corresponding P+ region 130 and N+ regions 128. The barrier metals 152 form ohmic contacts in the contact areas. In one example the barrier metals are made from nickel or titanium material, and deposited by a sputtering process.

The SiC MOSFET device as shown in FIG. 8 includes the three resistors R1, R2 and Rg which are formed by an undoped, pad polysilicon (not shown in FIG. 8) deposited on the surface by LP-CVD process, trimmed to the correct resistivity, and implanted with the first conductivity type (N type) dopants, such as phosphorus or arsenic. The resistors R1 and R2 are formed with a lower dosage of the dopants, while the resistor Rg and a gate polysilicon 156 are formed using the same process but with a much higher dosage. The thickness of the undoped polysilicon is in the range of 4000 A to 8000 A. One can see from FIG. 8 that each ends of the resistors has a substantially "T" cross-section, since they extend downward through the field oxide 148 and contact the P+ region 130 in the resistor region, where the P+ region 130 is used as an ohmic contact for the gate of the JFET J1. The previously mentioned P− shield bus lines connect multiple P− shield regions **124*a* of each transistor unit cells together and integrate to the P+ region 130 underneath the resistor region. The resistor Rg on the other hand does not contact the P+ region 130 underneath the resistor region, but it connects the polysilicon material 134 in the trenches 136 in the transistor unit cells to the gate electrode 158. One can see that the circuit connections shown in FIG. 1 are reflected in the cell layout of FIG. 8**.

On top of the different portions of the field oxide 148 as well as on top of the resistors R1, R2, Rg and the gate polysilicon 156, there is configured an interlayer dielectric (ILD) layer which contains multiple ILD portions 154. The ILD portions 154 act as dielectric insulating portions insulate each components in the transistor region and resistor region. Just like the field oxide 148, the ILD layer is not continuous but it opens certain windows as contact areas to form electrode contacts, thus resulting in individual ILD portions 154. For those ILD portions 154 on top of the trenches 136, they cover not only the top surface of the corresponding oxide portions **148*b* of the field oxide 148 but also side surfaces of these oxide portions 148*b*. Note that the ILD portions 154 do not cover the entire top surfaces of resistors R1, R2, Rg and the gate polysilicon 156. It leaves the windows at each ends of resistors and the gate pad 142** for connection through metallization. In one example the ILD layer is made from phosphosilicate glass (PSG), and is deposited by LP-CVD or PE-CVD process. In one example the thickness of this ILD material is in the range of 8000 A to 15000 A.

As a topmost component, there is a layer of power metal deposited and patterned above the various electrode contacts. The power metal in the transistor region is the source electrode 150 (at which Vss exists in FIG. 7). The source electrode 150 connects each P+ regions 130 and N+ regions 128 in N-Channel MOSFET Q1 through the barrier metals 152, and also the source electrode 150 connects to the resistor R2. The power metal in the resistor region is the gate electrode 158 (at which Vg in FIG. 7 is present), which connects the polysilicon material 134 in the trenches 136 in the transistor unit cells, through the gate polysilicon 156 and the gate resistor Vg, to the gate electrode 158. In one example, the power metal is aluminum, which is formed by a sputtering process. The thickness of this aluminum for example is in the range of 3 μm to 5 μm.

The metal layer of back metal is deposited at the opposite side of the SiC surface to form the drain electrode 146 (at which Vdd in FIG. 7 is present). This back metal is normally deposited after the silicon carbide substrate 120 is thinned down to the desirable thickness. It should be noted that passivation layers are not shown in FIG. 8. As skilled persons would understand, some surface passivation materials such as silicon oxide, silicon nitride and polyimide, are necessary in packaging of the SiC MOSFET device.

Figure 9A:
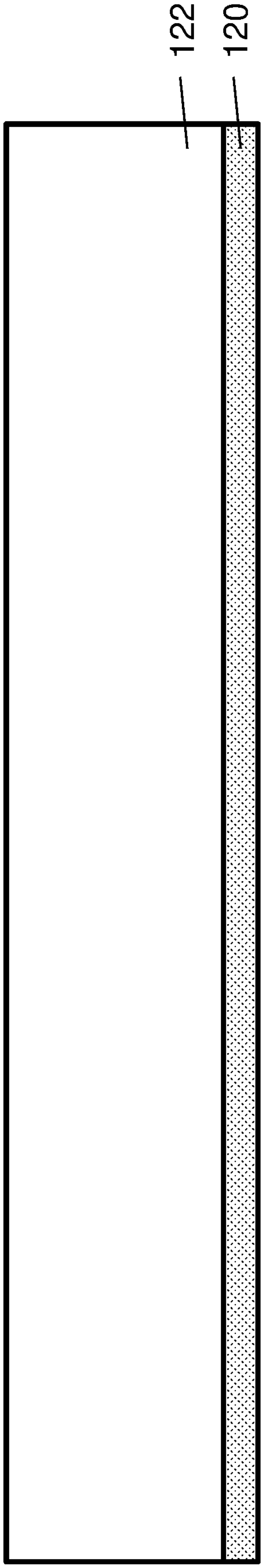
FIG. 9*a* shows a starting material for a method of fabricating a SiC MOSFET device according to another embodiment of the invention.
Figure 9T:
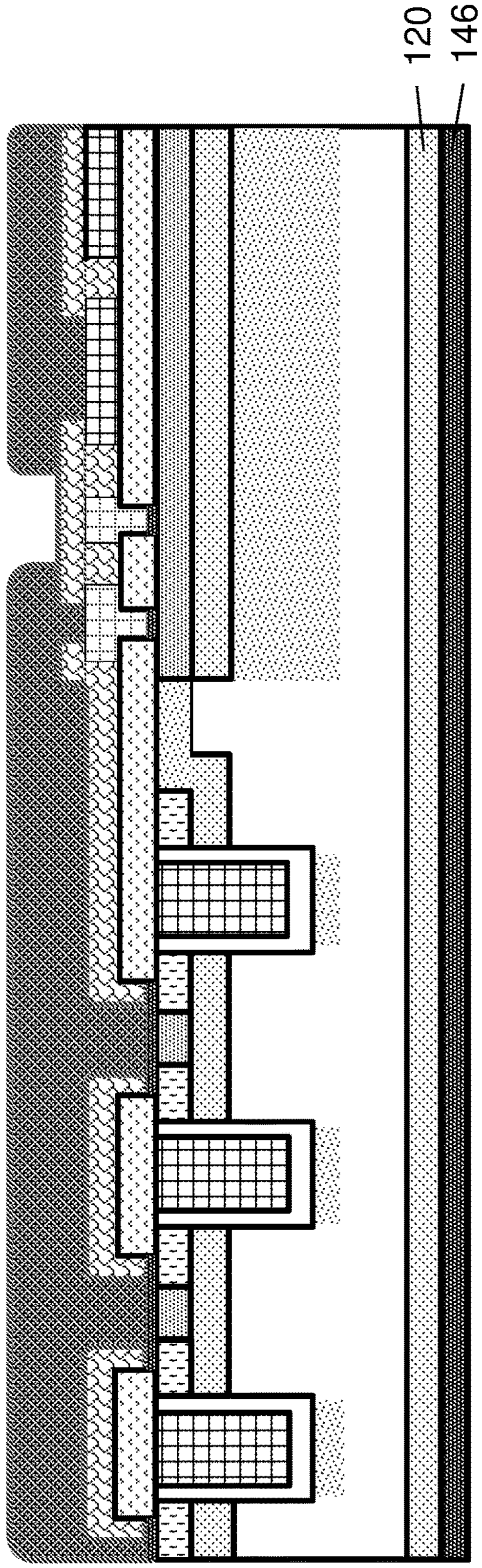
FIG. 9*t* illustrates the step of depositing, annealing back metal to form a drain electrode, following the step shown in FIG. 9*s.*
Figure 10:
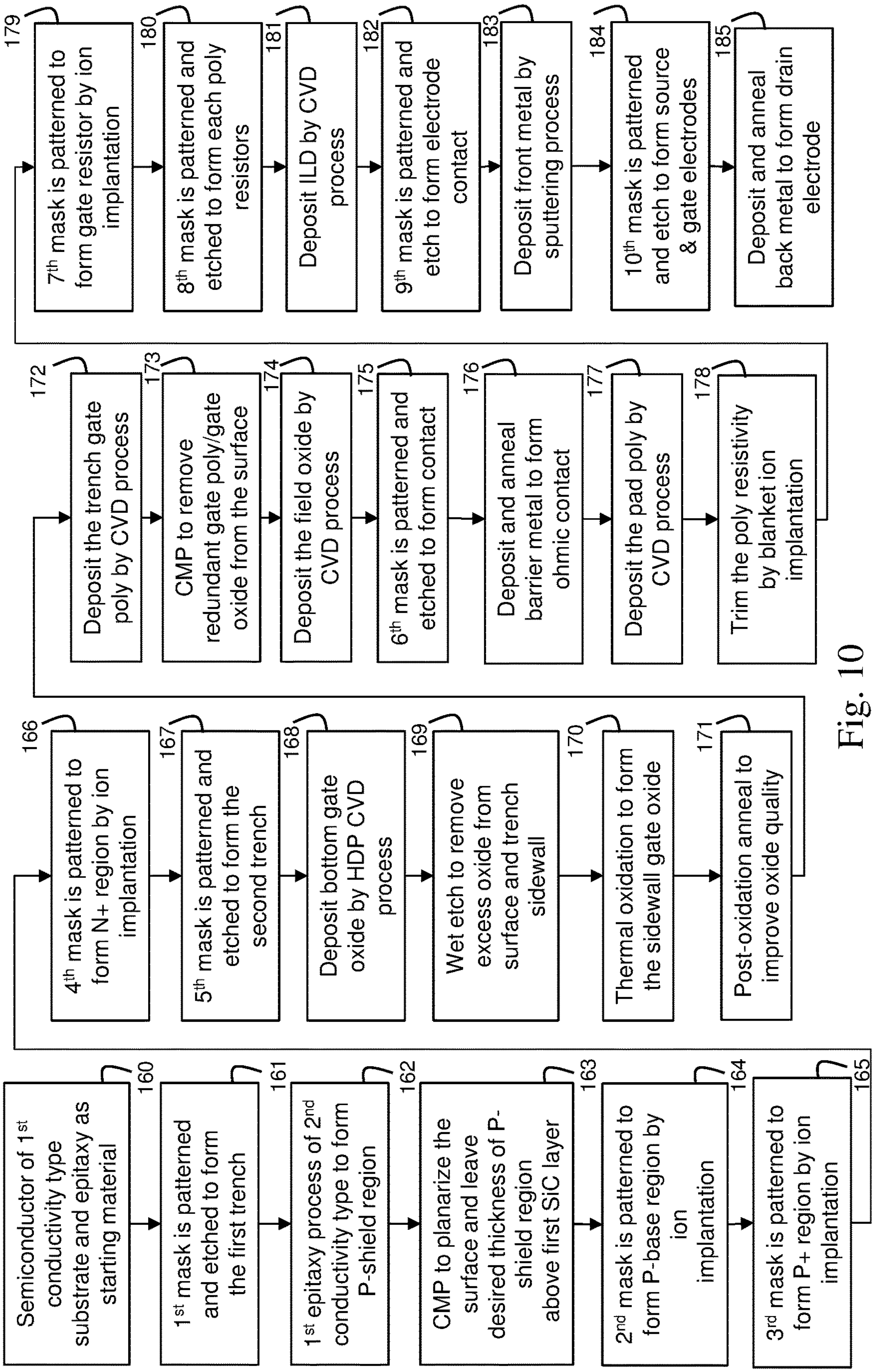
FIG. 10 is a flowchart summarizing the steps of the fabrication method in FIGS. 9*a*-9*t.*

FIG. **9*a*-9*t* show an exemplary method of how to produce the SiC MOSFET device in FIG. 8. FIG. 10 shows a flow chart that summarizes all the steps in the production process in FIGS. 9*a*-9*t*. Note that the exemplary method described in this embodiment is not intended to be limiting, as the SiC MOSFET device in FIG. 8 may be produced using other methods, and/or with different sequences of the steps. With reference to FIG. 10, the method starts at Step 160 in which a raw silicon carbide epi wafer which has been cleaned using the RCA clean procedures is prepared as shown in FIG. 9*a*. The wafer comes with a silicon carbide substrate 120 of N+ type and a first silicon carbide layer 122 on top thereof which is of N− type. It should be noted that a whole wafer will be processed to multiple MOSFET devices before the wafer is cut to individual chips of MOSFET devices. As mentioned previously the first silicon carbide layer 122 is an epitaxy N− drift layer less doped than the silicon carbide substrate 120**.

Figure 9B:
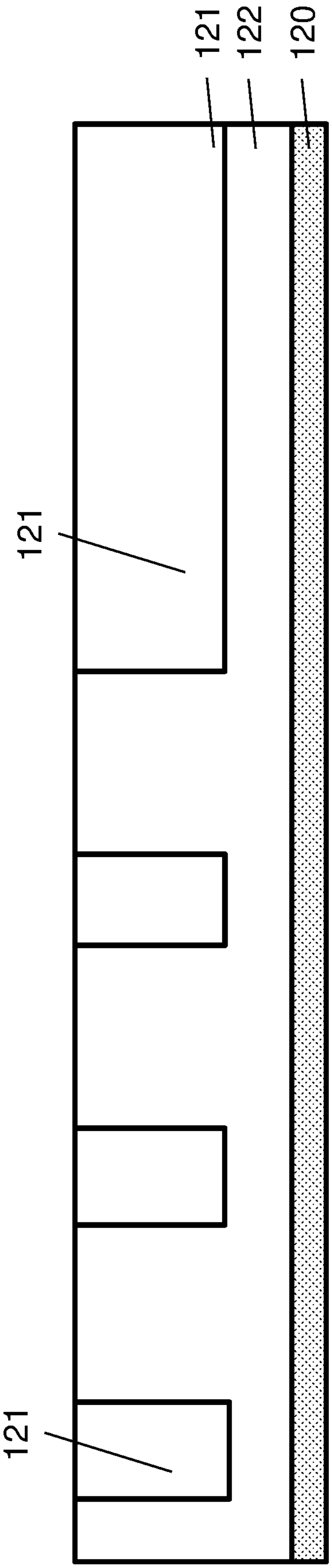
FIG. 9*b* illustrates the step of patterning and etching first trenches from the SiC surface into the N− drift layer of the starting material of FIG. 9*a*.
Figure 9C:
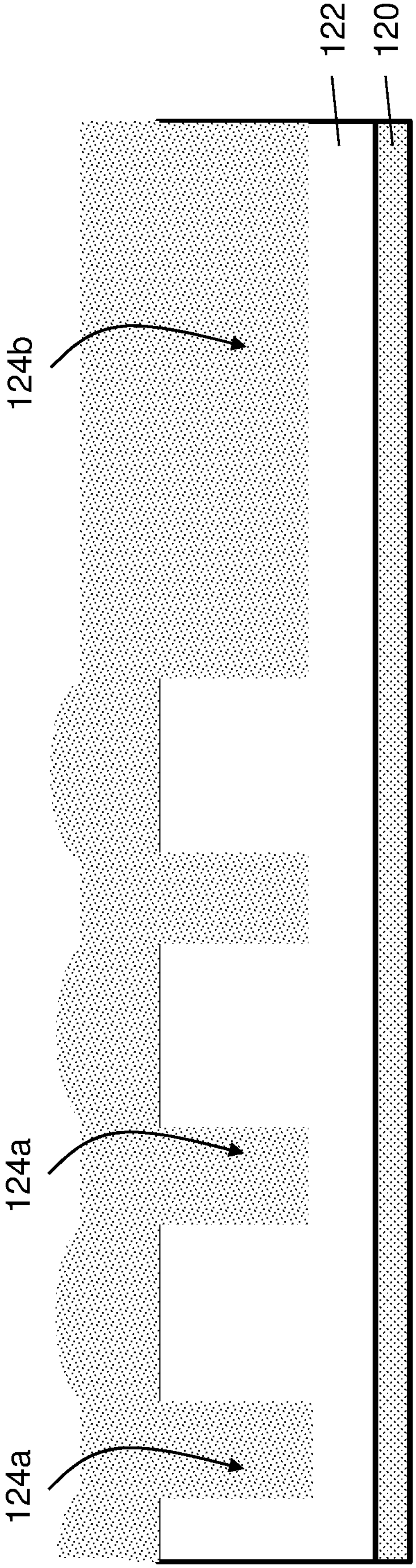
FIG. 9*c* illustrates the step of forming P− shield region by an epitaxy process following the step shown in FIG. 9*b*.
Figure 9D:
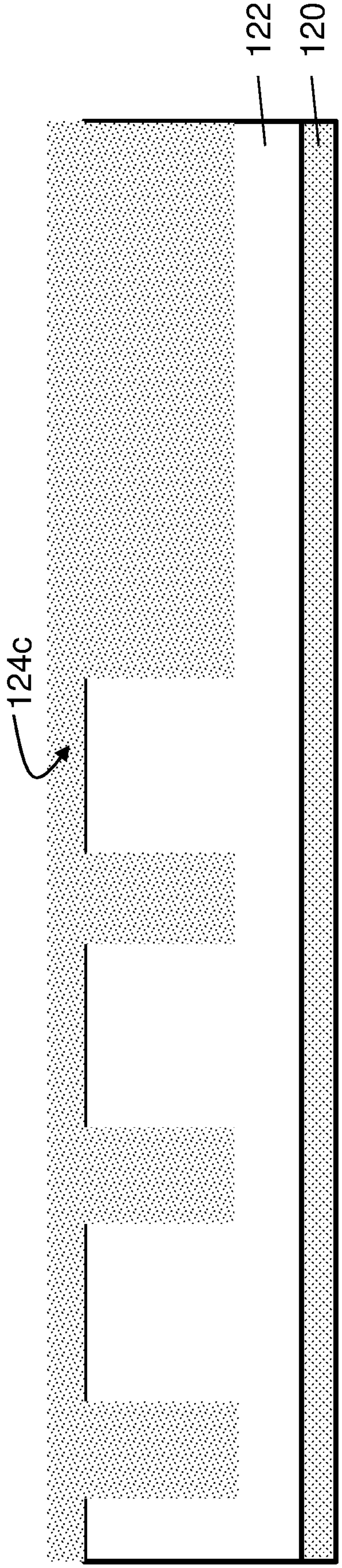
FIG. 9*d* illustrates the step of removing redundant P− shield portion using Chemical-Mechanical Planarization (CMP) following the step shown in FIG. 9*c*.

Then, in Step 161 a plurality of first trenches 121 is patterned using a first mask (e.g. a dielectric mask such as $SiO_2$), and etched from the SiC surface into the first silicon carbide layer 122 as shown in FIG. **9*b*. Up to this step, the SiC surface is the top surface of the first silicon carbide layer 122 as shown in FIGS. 9*a*-9*b*. Preferably the first trenches 121 have a trench width in the range of 0.3 μm to 0.8 μm, and a trench depth in the range of 1.2 μm to 2.0 μm. The first trenches 121 in Step 162 are then filled with a second silicon carbide layer of a second conductivity type (P type) by epitaxy to make P− shield regions 124*a*, 124*b*, as shown in FIG. 9***c*. Each P− shield region 124*a* corresponds to a transistor unit cell in the transistor region, and the P− shield region 124*b* corresponds to the resistor region. At this stage the P− shield regions 124*a* fill completely corresponding trenches, which is different from the end device after fabrication in which the P− shield regions 124*a* only exist underneath corresponding trenches as shown in FIG. 8. As mentioned before, the P− shield regions 124*a* consist of multiple P− shield junctions at each transistor unit cell and P− shield bus lines (not shown). These P− shield junctions form the gate of JFET J1 and act to protect the trench gate oxide of the N-Channel MOSFET Q1. The P− shield bus lines connect multiple P− shield junctions of each transistor unit cell together and integrate to a junction underneath resistors region.

Figure 9E:
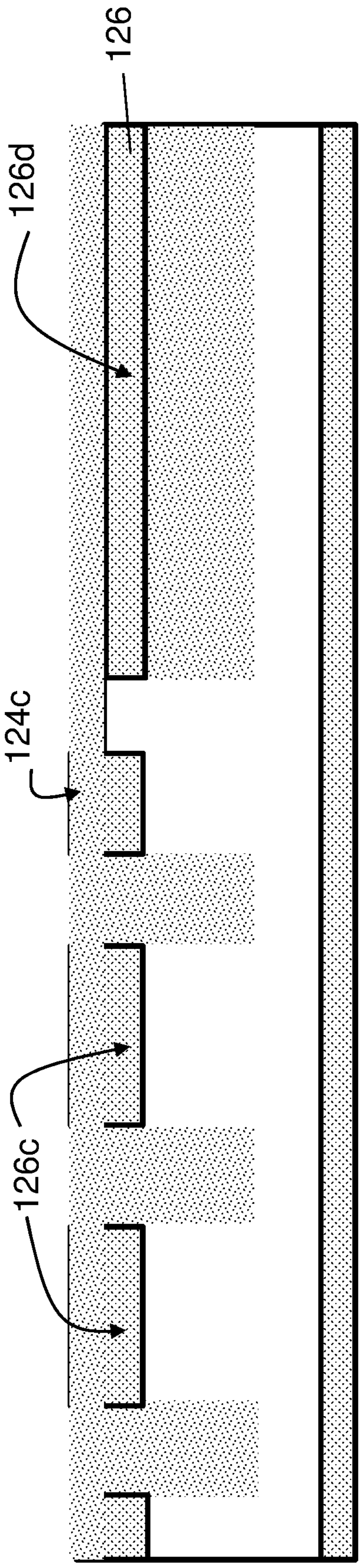
FIG. 9*e* illustrates the step of patterning and implanting P− base region following the step shown in FIG. 9*d.*
Figure 9F:
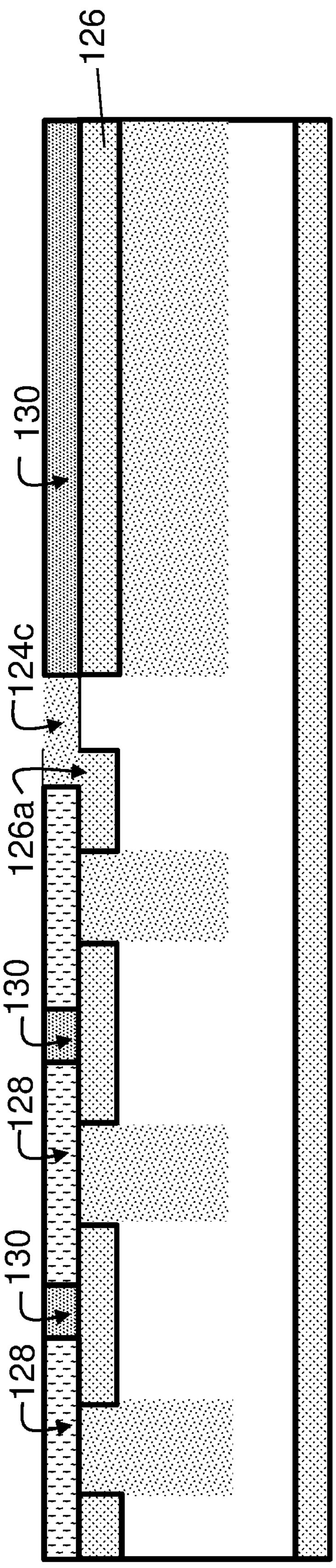
FIG. 9*f* illustrates the step of patterning and implanting P+ regions and N+ regions following the step shown in FIG. 9*e.*

In Step 163, CMP is carried out to remove redundant P− shield portion and planarize the SiC surface. As a result, a desired thickness (see the part 124*c* in FIG. 9*d*) of P− shield region is left above first silicon carbide layer 122. Next, in Step 164 a third silicon carbide layer 126 of the second conductivity type (P type) is formed by patterning and ion-implantation processes using a second mask, as shown in FIG. 9*e*. The third silicon carbide layer 126 contains the P− base regions 126*c*, 126*d*. Note that during the formation of the third silicon carbide layer 126, the junction depth of P− base implantation is well controlled to implant through the P− shield region so that part of the P− shield region 124*c* near the surface remains unchanged. After the third silicon carbide layer 126 is formed, the method goes to Step 165 in which a third mask is patterned to form P+ regions 130 by ion implantation, and to Step 166 in which a fourth mask is patterned to form N+ regions 128 by ion implantation. The fabricated P+ regions 130 and N+ regions 128 are shown altogether in FIG. 9*f*. Note that during the formation of P+ regions 130 and N+ regions 128, the top portion of P− shield region 124*c* which has a P− type is counter-doped by the P+ implantation or N+ implantation. There is only one region in the top portion of P− shield region 124*c* that is not counter-doped, which disconnect the transistor region from the resistor region.

Figure 9G:
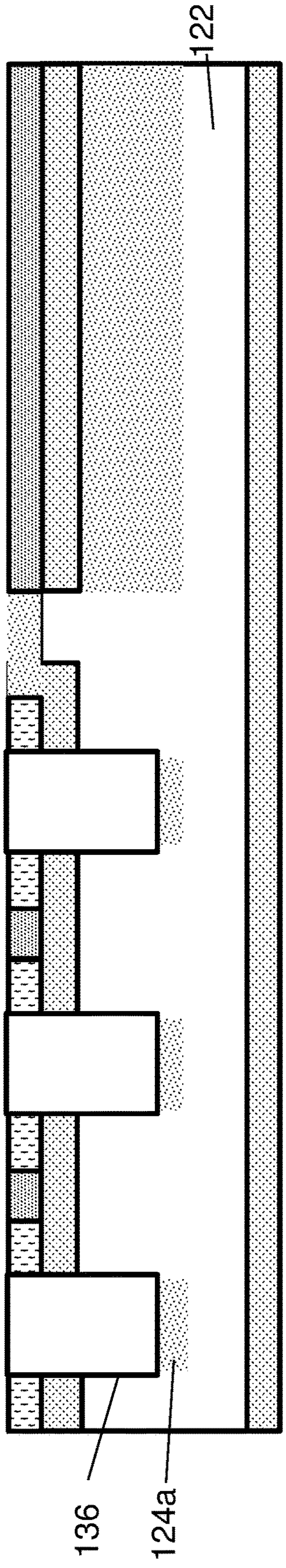
FIG. 9*g* illustrates the step of patterning and etching second trenches following the step shown in FIG. 9*f.*

After the various silicon carbide layers have been fabricated as above, the method then goes to Step 167 in which the trenches 136 are patterned and etched into the first silicon carbide layer 122 using a fifth mask, and the trenches 136 align with and extend from each adjacent P− shield region 124*a* laterally. The extension depends on the alignment and critical dimension (CD) control capability. In other words, each trench 136 has a width which is larger than its corresponding P− shield region 124*a*, as shown in FIG. 9*g*.

Figure 9H:
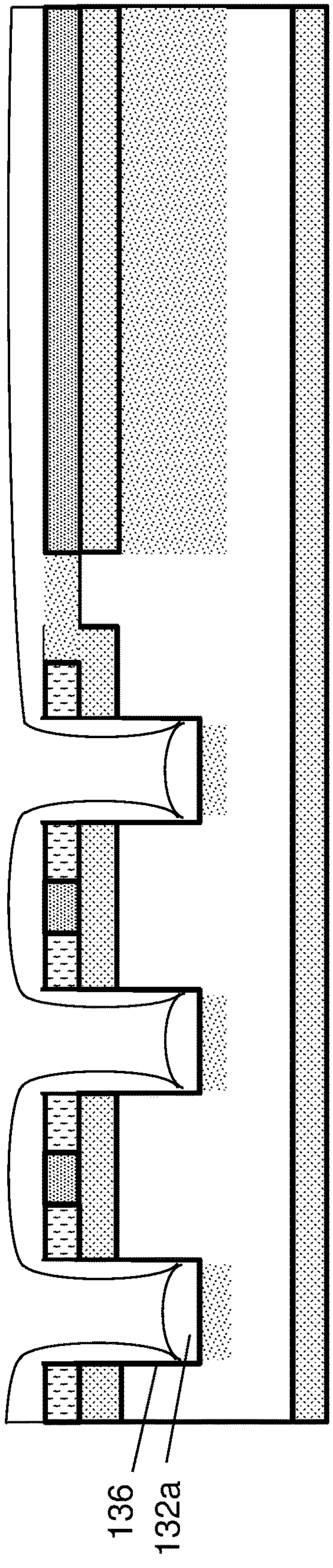
FIG. 9*h* illustrates the step of depositing bottom gate oxide by a High-Density Plasma Chemical Vapor Deposition (HDP-CVD) process, following the step shown in FIG. 9*g.*
Figure 9I:
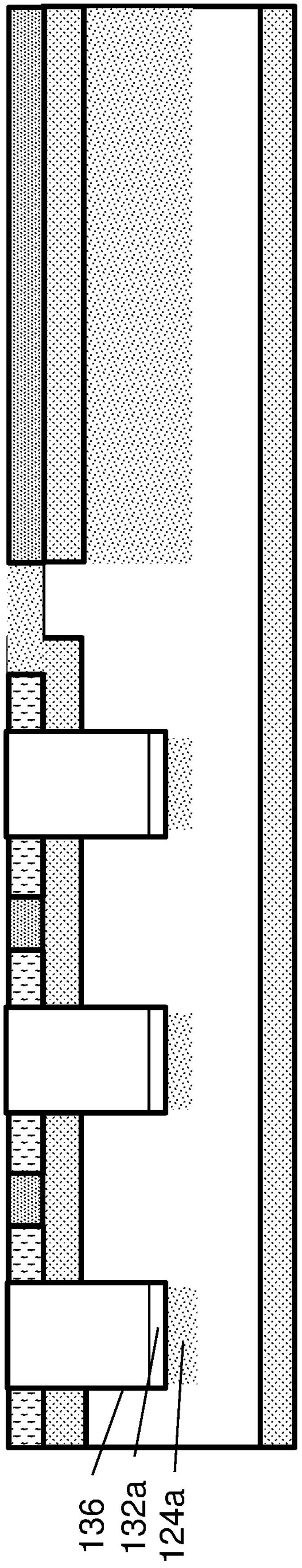
FIG. 9*i* illustrates the step of removing redundant portion of the bottom gate oxide by oxide etching, following the step shown in FIG. 9*h.*
Figure 9J:
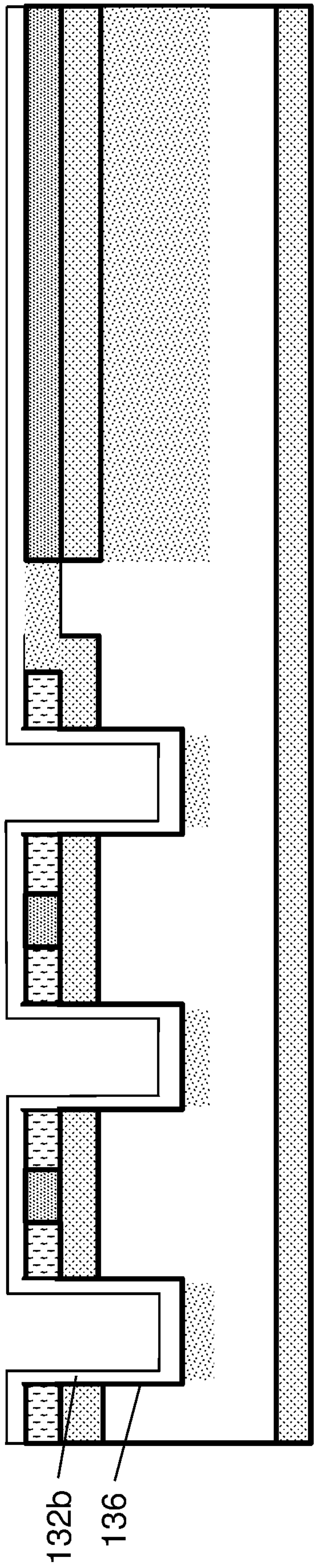
FIG. 9*j* illustrates the step of forming sidewall gate oxide by oxidation process, following the step shown in FIG. 9*i.*

Next, in Step 168 the bottom gate oxide 132*a* is deposited using a HDP-CVD process as shown in FIG. 9*h*, followed by a wet etching to remove oxide on surface and sidewall of the trenches 136 in Step 169 and shown in FIG. 9*i*. This results in the bottom gate oxide 132*a* having a thickness in the range of 1000 A to 4000 A in one example. On the other hand, in Step 170 the sidewall gate oxide 132*b* is formed by a thermal oxidation process as shown in FIG. 9*j*, with a post-oxidation annealing in Step 171 to enhance electrical and interface properties.

Figure 9K:
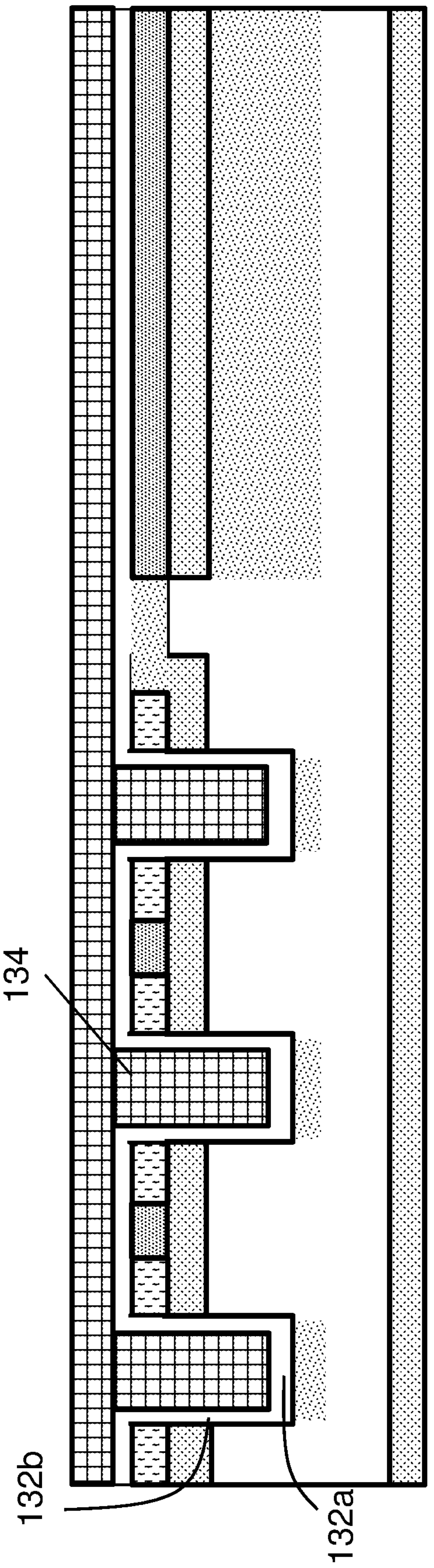
FIG. 9*k* illustrates the step of forming trench gate polysilicon by a CVD process, following the step shown in FIG. 9*j.*
Figure 9L:
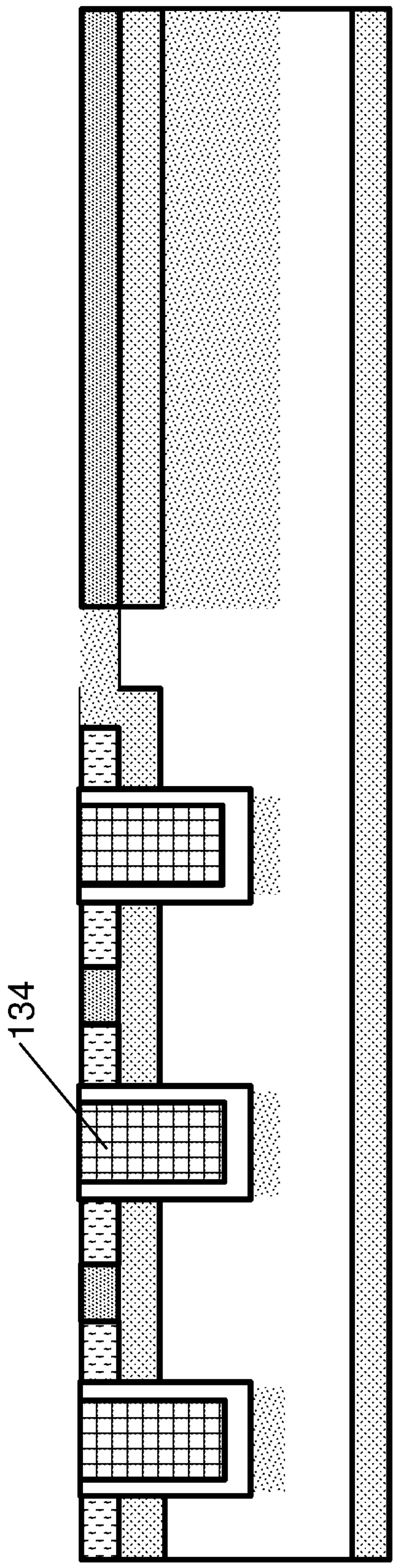
FIG. 9*l* illustrates the step of removing redundant gate polysilicon and gate oxide using CMP, following the step shown in FIG. 9*k.*

In Step 172, the polysilicon material 134 is embedded in each of the trenches 136. As shown in FIG. 9*k*, the initially embedded polysilicon material 134 is an entire layer that covers the bottom gate oxide 132*a*, the sidewall gate oxide 132*b* and the SiC surface. The polysilicon material 134 is deposited by LP-CVD, with in-situ doping. To ensure a good coverage and planarized surface, preferably a minimum of 5000 A thickness of the polysilicon material 134 above the SiC surface is necessary. Afterwards, in Step 173 CMP is conducted to remove redundant gate polysilicon or gate oxide from the SiC surface, which results in the layout shown in FIG. 9*l*. The polysilicon material 134 then becomes discontinuous and resides only in each of the trenches 136.

Figure 9M:
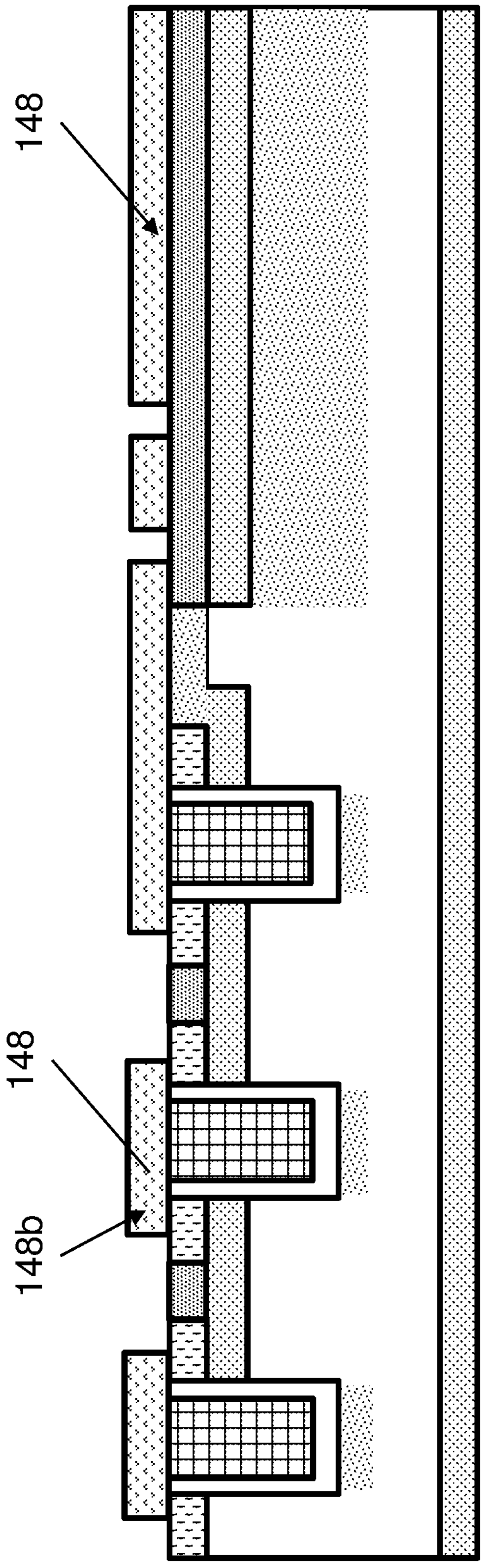
FIG. 9*m* illustrates the step of depositing field oxide by CVD followed by patterning and etching to form contacts areas, following the step shown in FIG. 9*l.*
Figure 9N:
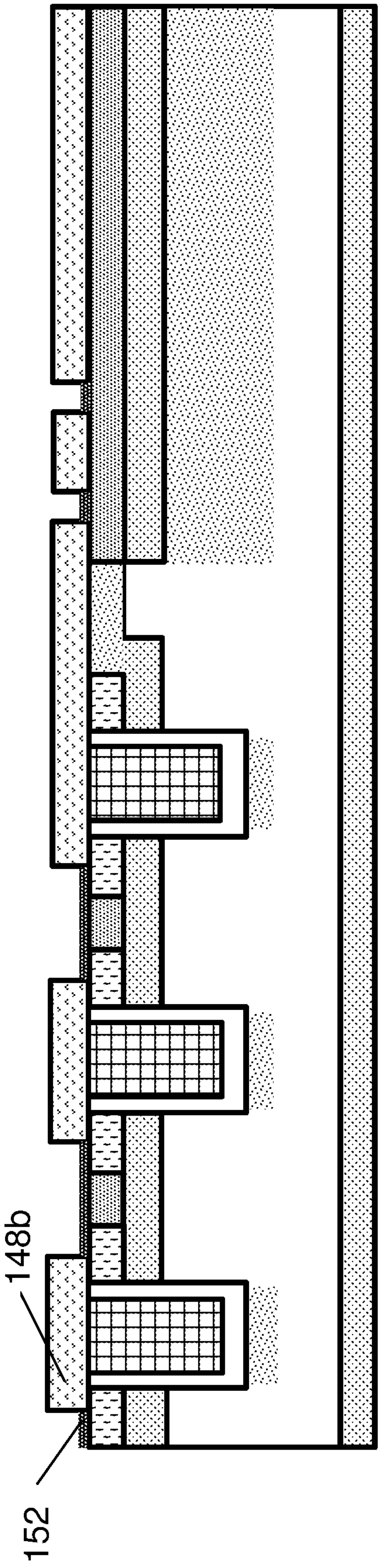
FIG. 9*n* illustrates the step of depositing and annealing barrier metal to form ohmic contacts, following the step shown in FIG. 9*m.*

In Step 174, the field oxide 148 is deposited by a CVD process, which is then patterned and etched using a sixth mask in Step 175 to form contact areas for connection between components above and below the SiC surface. As mentioned above these contact areas are located between adjacent oxide portions 148*b*. The etched field oxide 148 is shown in FIG. 9*m*. In Step 176, the barrier metals 152 are deposited (including in the contact areas mentioned above) and annealed to form the ohmic contact, as shown in FIG. 9*n*. Each barrier metal 152 is located between two adjacent oxide portions along a horizontal direction.

Figure 9O:
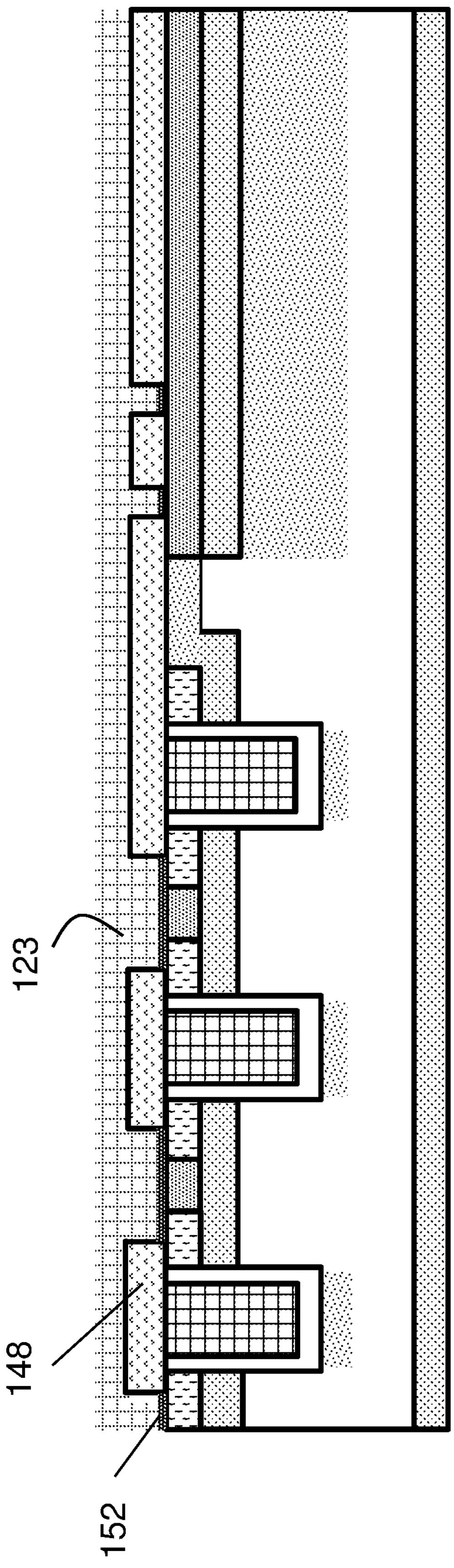
FIG. 9*o* illustrates the step of depositing a pad polysilicon by CVD and trimming the polysilicon's resistivity by blanket ion implantation, following the step shown in FIG. 9*n.*
Figure 9P:
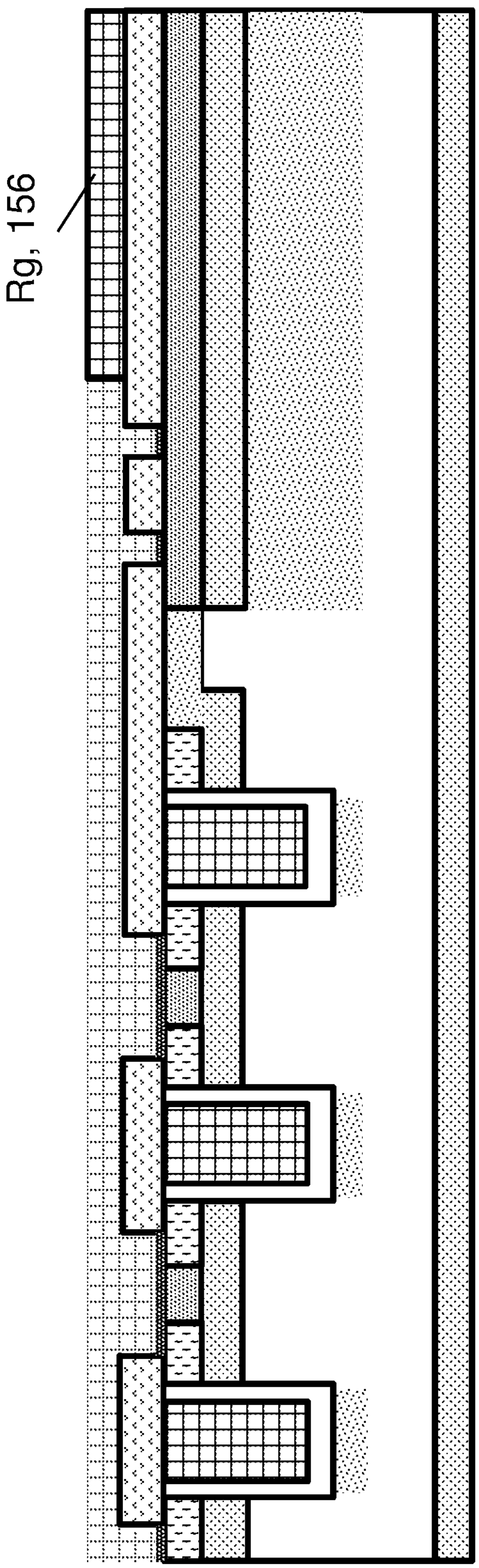
FIG. 9*p* illustrates the step of patterning and implanting to form highly doped gate resistor and gate bus polysilicon, following the step shown in FIG. 9*o.*
Figure 9Q:
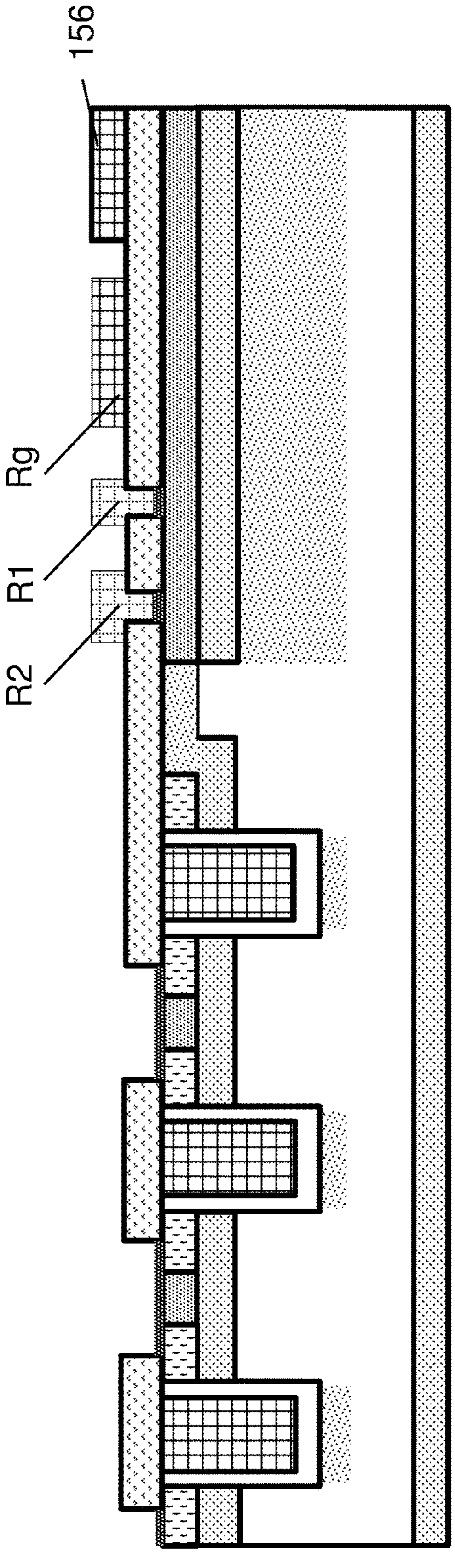
FIG. 9*q* illustrates the step of patterning and etching to separate each polysilicon resistors and gate bus polysilicon, following the step shown in FIG. 9*p.*

In Step 177, a pad polysilicon 123 is deposited by CVD on top of the field oxide 148 and the barrier metals 152, as shown in FIG. 9*o*, and then resistivity of the pad polysilicon 123 is trimmed in Step 178 by blanket ion implantation with a lower dosage of dopants. As mentioned above, the pad polysilicon 123 eventually forms the resistors R1, R2, Rg, and the gate polysilicon 156 as shown in FIG. 9*q*. In Step 179 the appropriate portions of the pad polysilicon 123 is patterned using a seventh mask, and then ion implantation with a higher dosage of dopants is performed to form the resistors Rg and the gate polysilicon 156 as shown in FIG. 9*p*. After that, in Step 180 an eighth mask is used for patterning and etching to separate resistors R1, R2, Rg, and the gate polysilicon 156 from each other, which are shown in FIG. 9*q*.

Figure 9R:
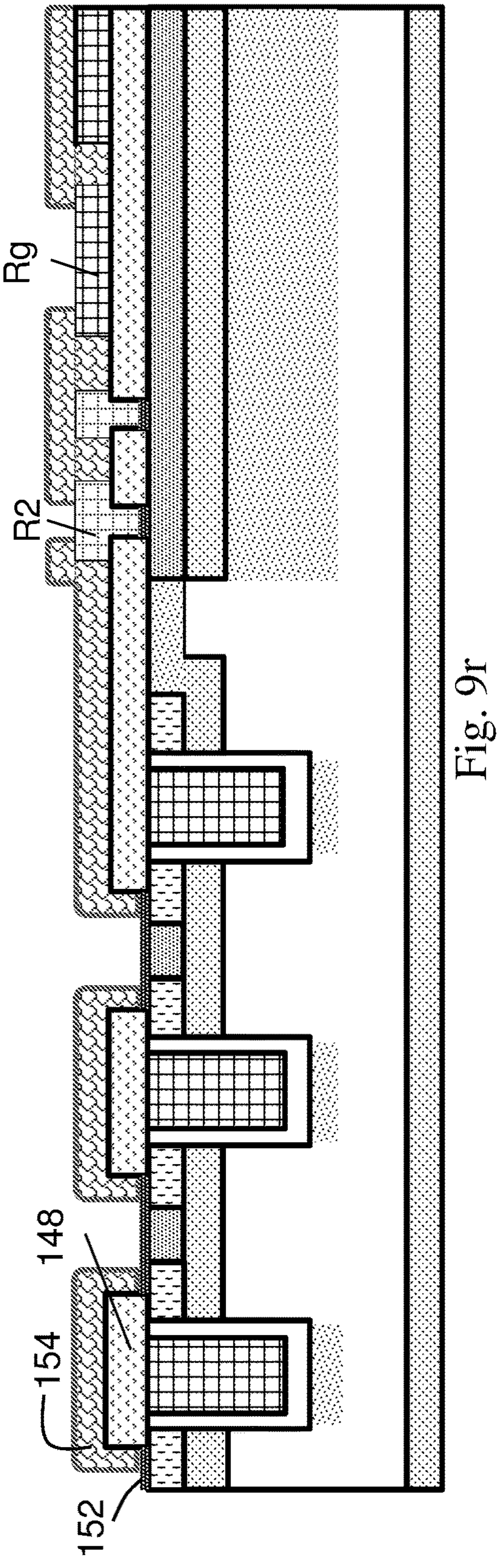
FIG. 9*r* illustrates the step of depositing an ILD layer, patterning and etching the same to form electrode contacts, following the step shown in FIG. 9*q.*
Figure 9S:
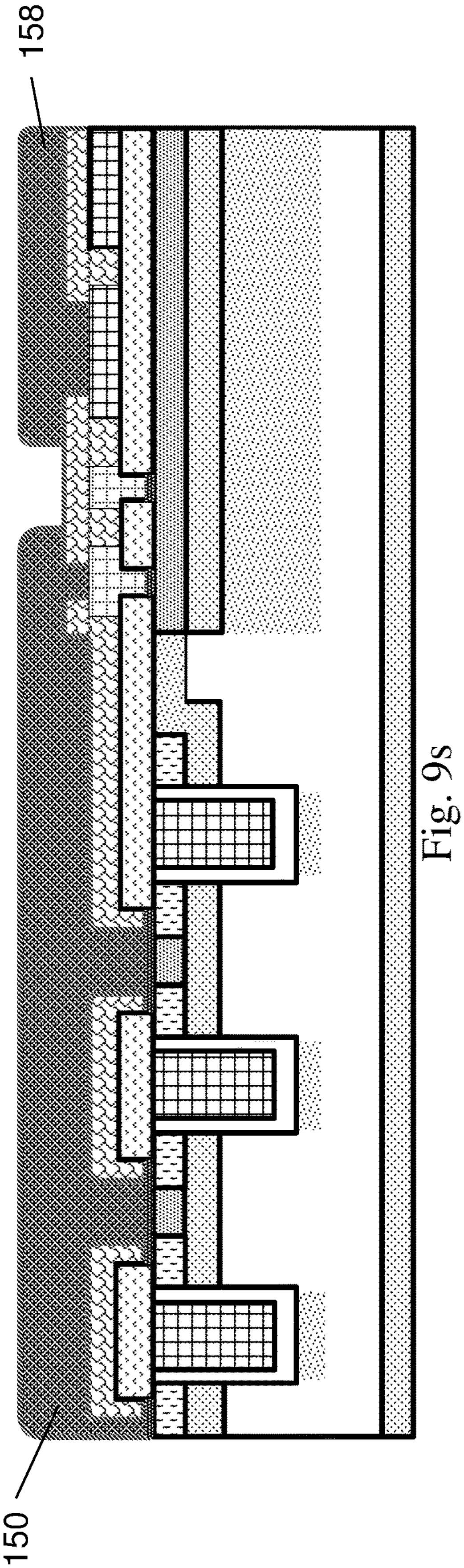
FIG. 9*s* illustrates the step of depositing, patterning and etching front metal to form a source electrode and a gate electrode, following the step shown in FIG. 9*r.*

Next, in Step 181 the ILD layer is deposited on top of the field oxide 148 and the barrier metal 152, and then the ILD layer is patterned and etched in Step 182 using a ninth mask to form multiple ILD portions 154, between which contact areas for electrode contacts can be formed. The individual ILD portions 154 separated by the contact areas are shown in FIG. 9*r*. In Step 183, the front metal is deposited using a sputtering process which will be used to make the source electrode 150 and the gate electrode 158. In Step 184, a tenth mask is used for patterning and etching the front metal so that the source electrode 150 and the gate electrode 158 are separated from each other, as shown in FIG. 9*s*. Lastly, in Step 185 the back metal is deposited and annealed at the backside of the silicon carbide substrate 120 of the SiC MOSFET device, to form the drain electrode 146. To this step the manufacturing of the MOSFET device is then completed.

Figure 11A:
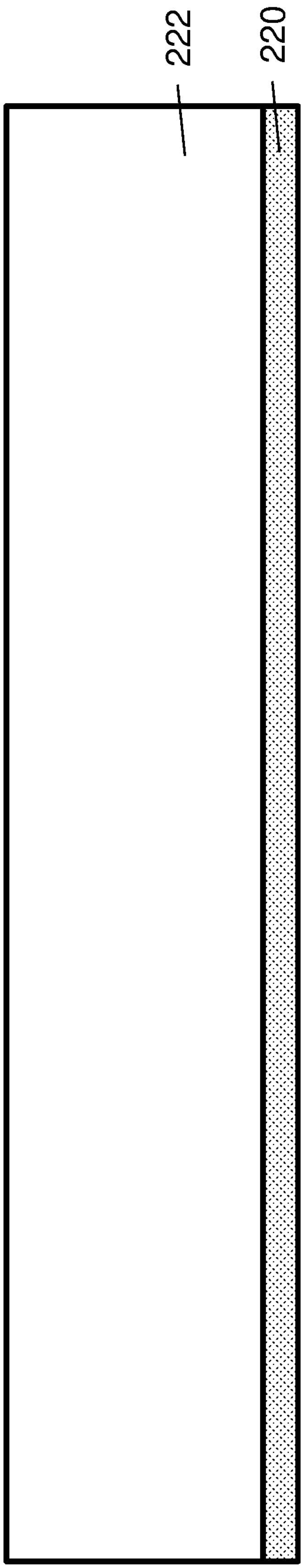
FIG. 11*a* shows a starting material for a method of fabricating a SiC MOSFET device according to a further embodiment of the invention.
Figure 11B:
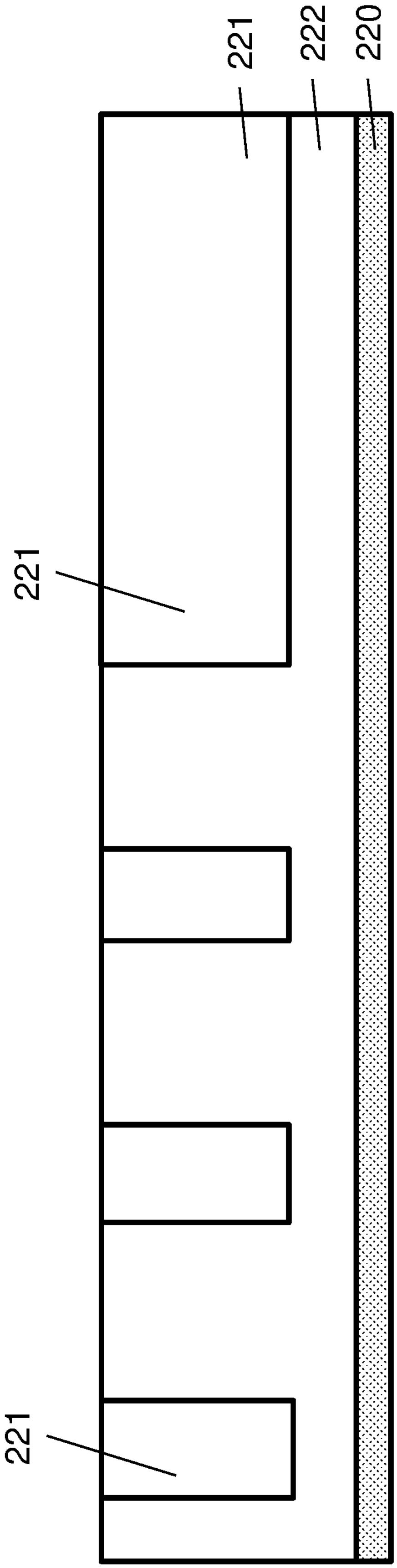
FIG. 11*b* illustrates the step of patterning and etching first trenches from the SiC surface into the N− drift layer of the starting material of FIG. 11*a.*
Figure 11C:
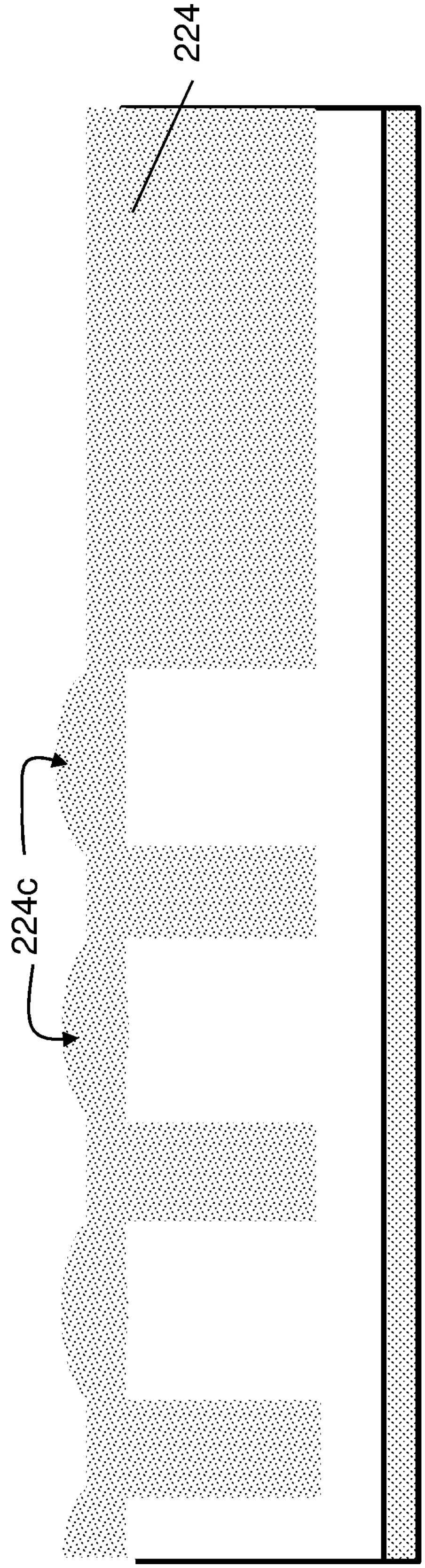
FIG. 11*c* illustrates the step of forming P− shield region by an epitaxy process following the step shown in FIG. 11*b.*
Figure 11D:
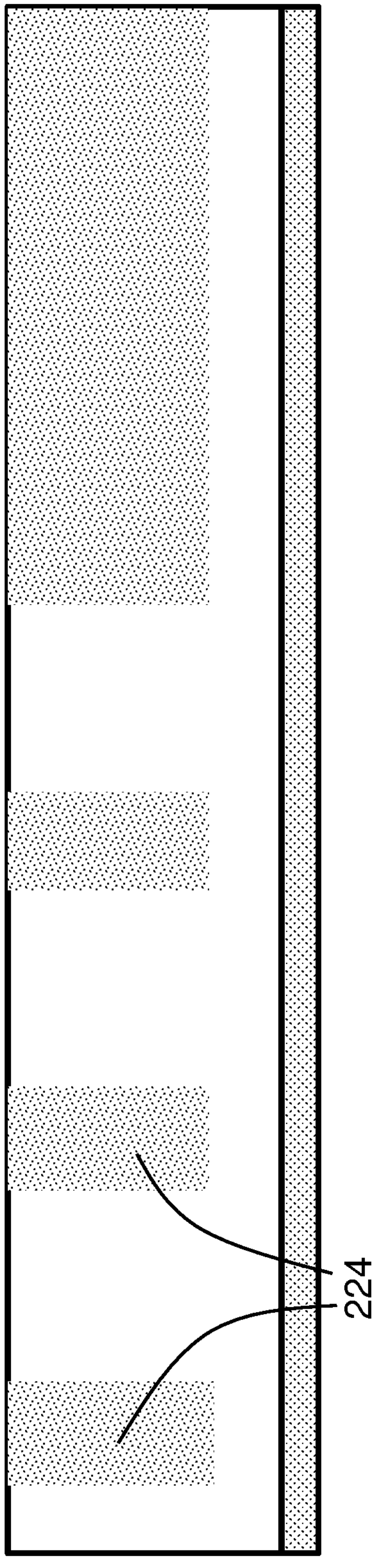
FIG. 11*d* illustrates the step of removing redundant P− shield portion using CMP following the step shown in FIG. 11*c.*
Figure 11E:
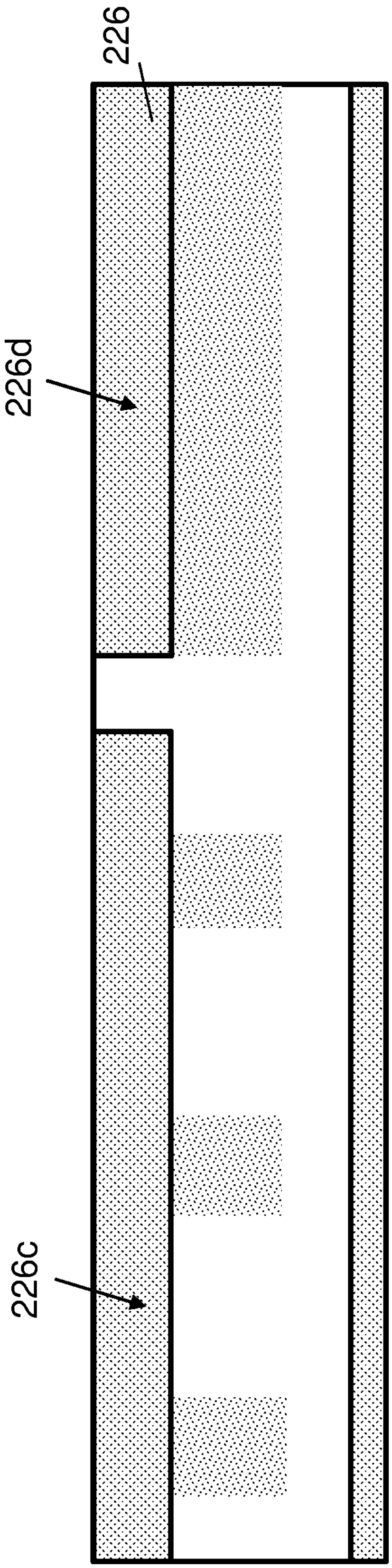
FIG. 11*e* illustrates the step of patterning and implanting P− base region following the step shown in FIG. 11*d.*
Figure 11F:
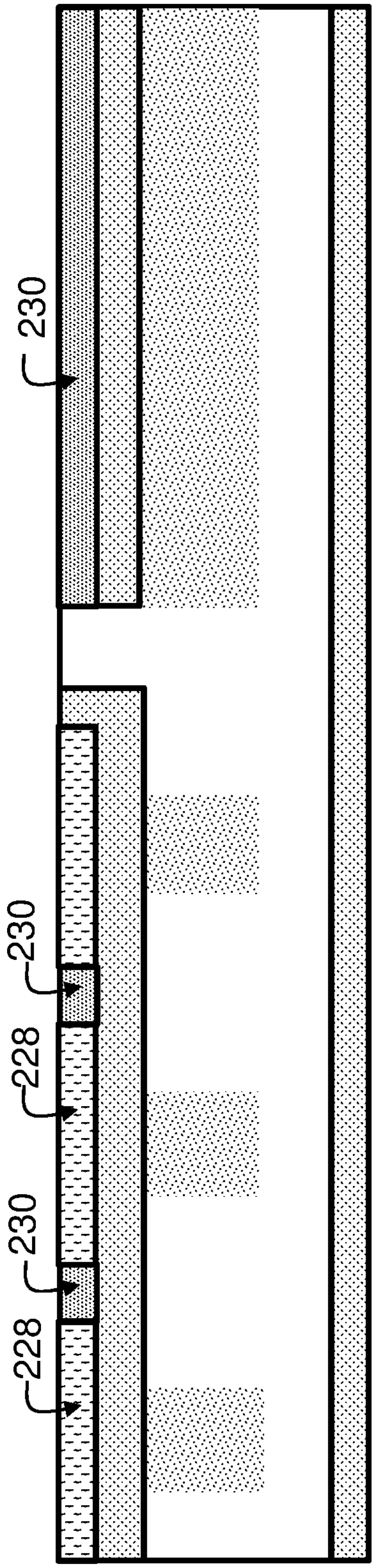
FIG. 11*f* illustrates the step of patterning and implanting P+ regions and N+ regions following the step shown in FIG. 11*e.*
Figure 11G:
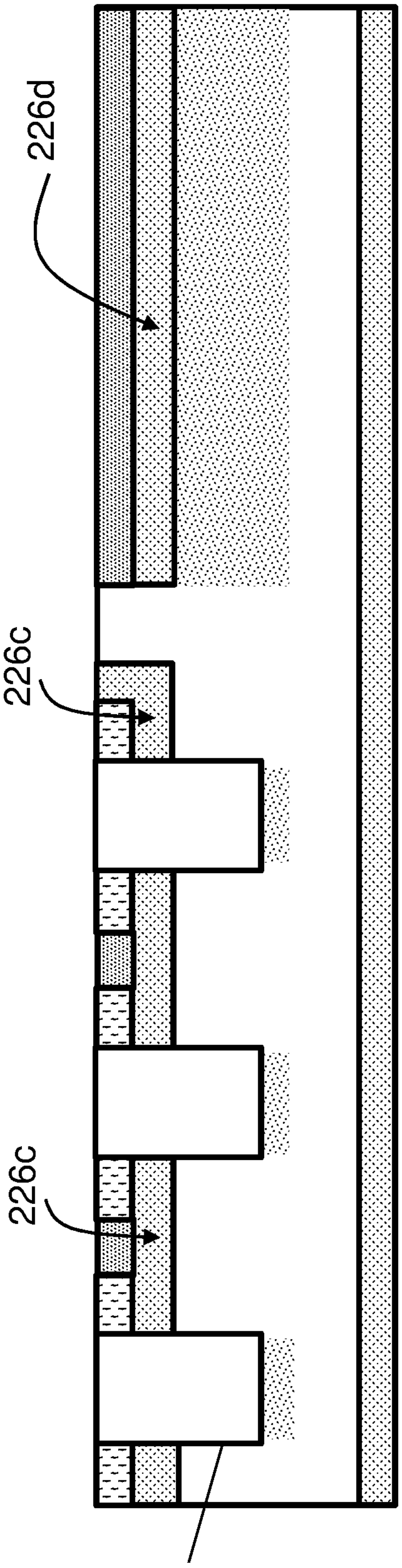
FIG. 11*g* illustrates the step of patterning and etching second trenches following the step shown in FIG. 11*f.*
Figure 11H:
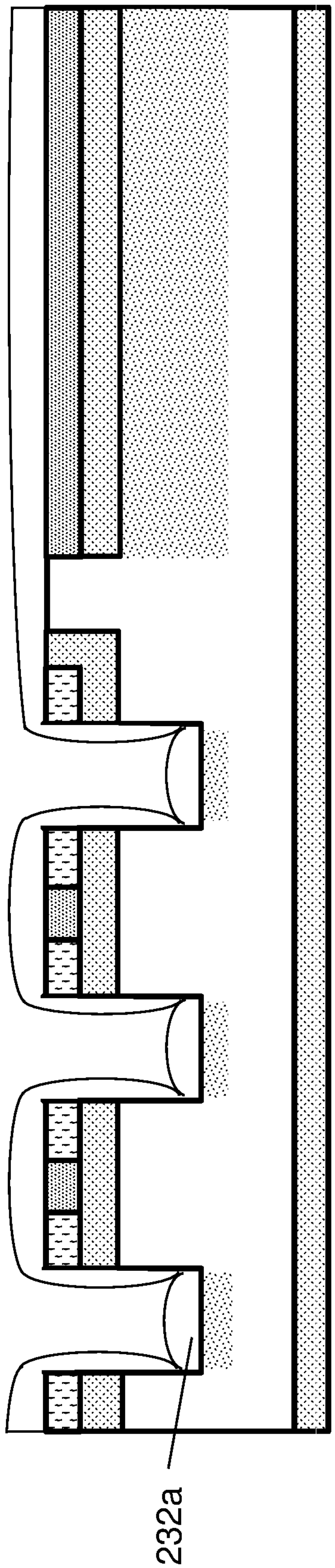
FIG. 11*h* illustrates the step of depositing bottom gate oxide by a HDP-CVD process, following the step shown in FIG. 11*g.*
Figure 11I:
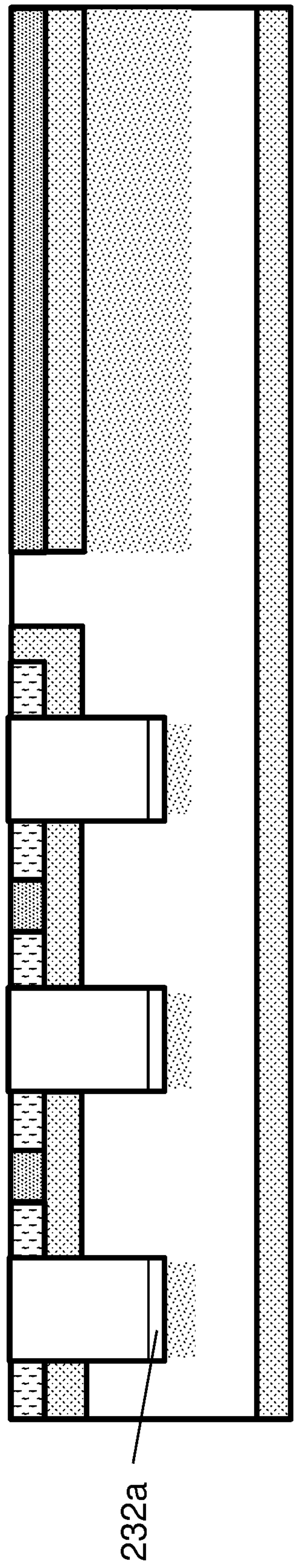
FIG. 11*i* illustrates the step of removing redundant portion of the bottom gate oxide by oxide etching, following the step shown in FIG. 11*h.*
Figure 11J:
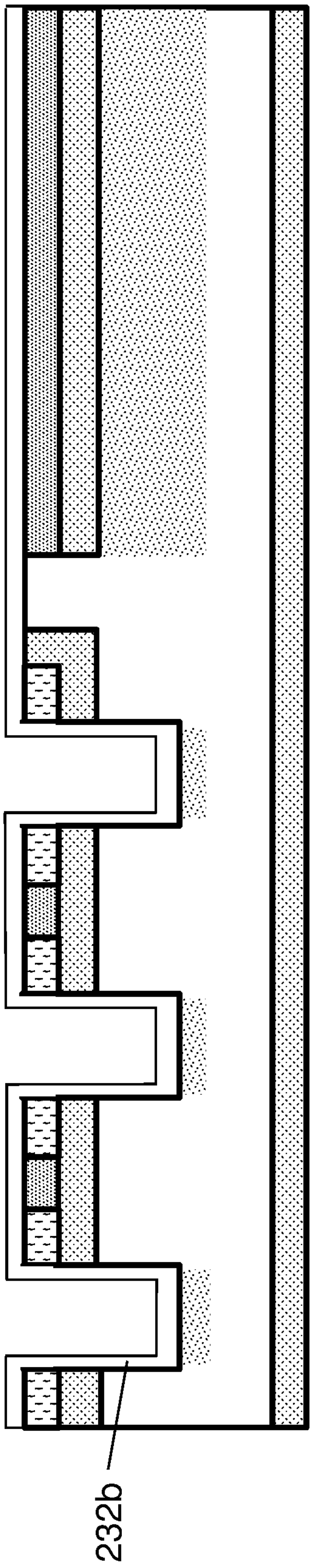
FIG. 11*j* illustrates the step of forming sidewall gate oxide by oxidation process, following the step shown in FIG. 11*i.*
Figure 11K:
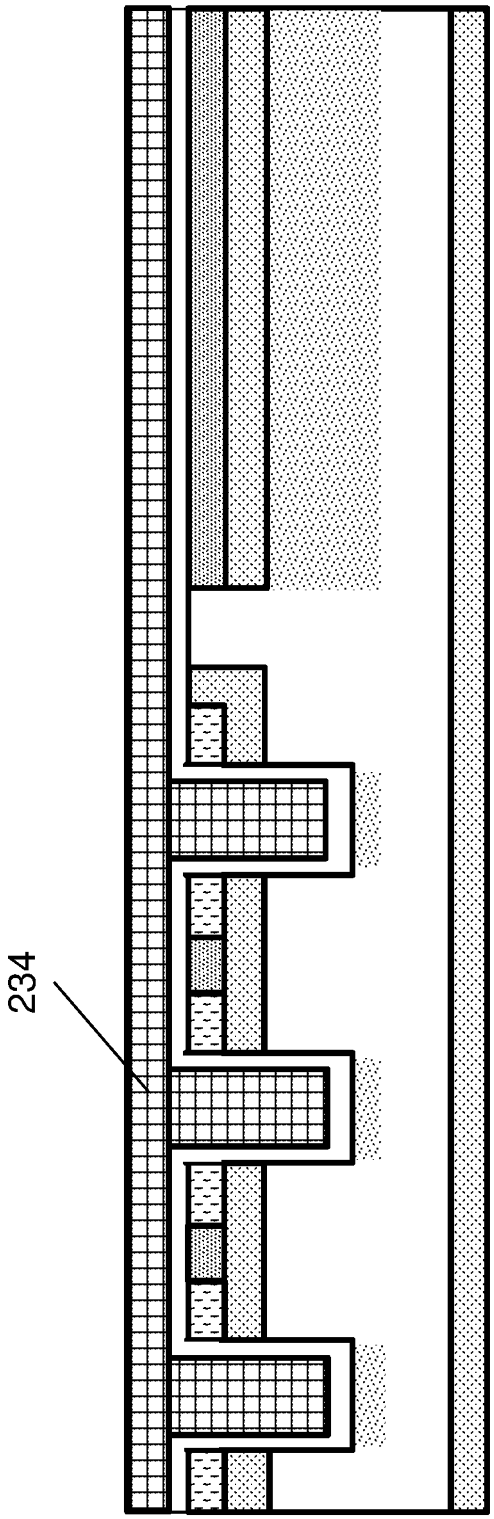
FIG. 11*k* illustrates the step of forming trench gate polysilicon by a CVD process, following the step shown in FIG. 11*j.*
Figure 11L:
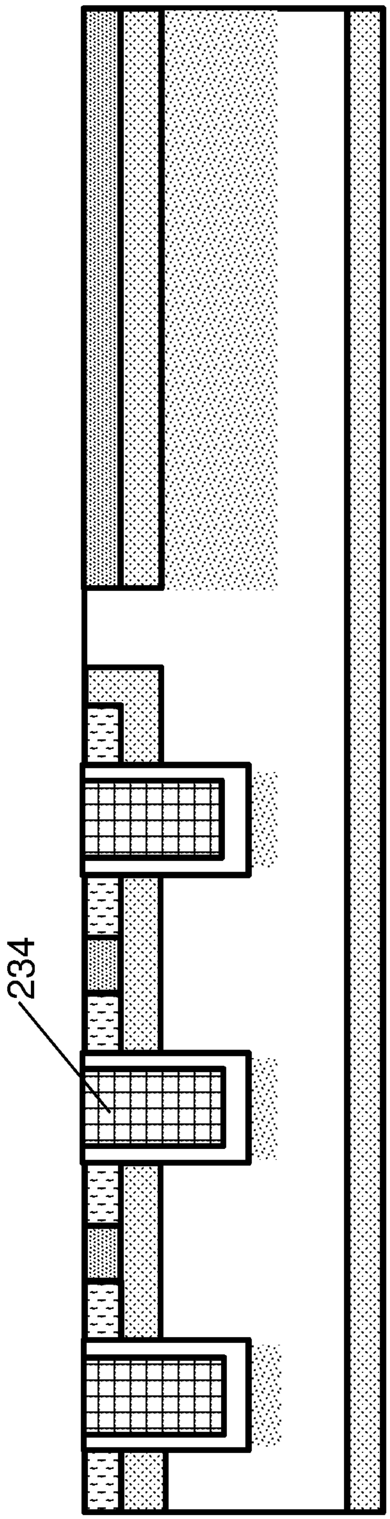
FIG. 11*l* illustrates the step of removing redundant gate polysilicon and gate oxide using CMP, following the step shown in FIG. 11*k.*
Figure 11M:
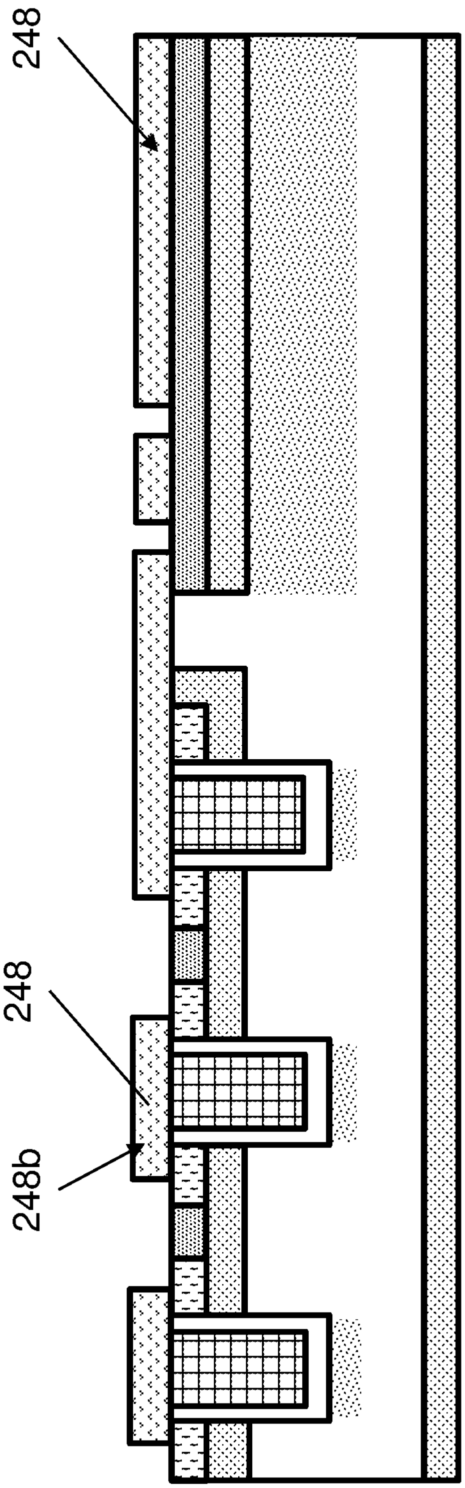
FIG. 11*m* illustrates the step of depositing field oxide by CVD followed by patterning and etching the same to form contact areas, following the step shown in FIG. 11*l.*
Figure 11N:
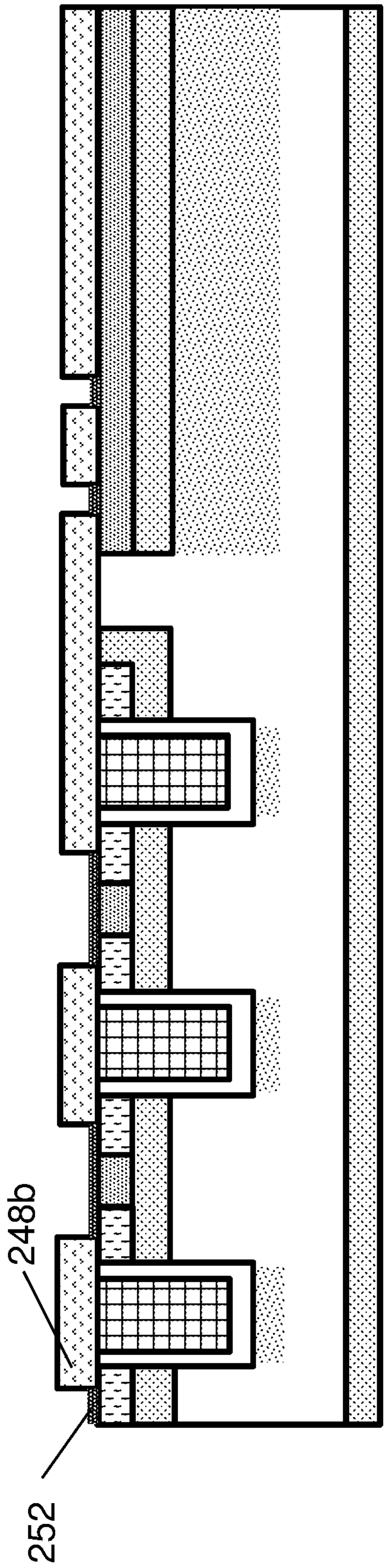
FIG. 11*n* illustrates the step of depositing and annealing barrier metal to form ohmic contacts, following the step shown in FIG. 11*m.*
Figure 11O:
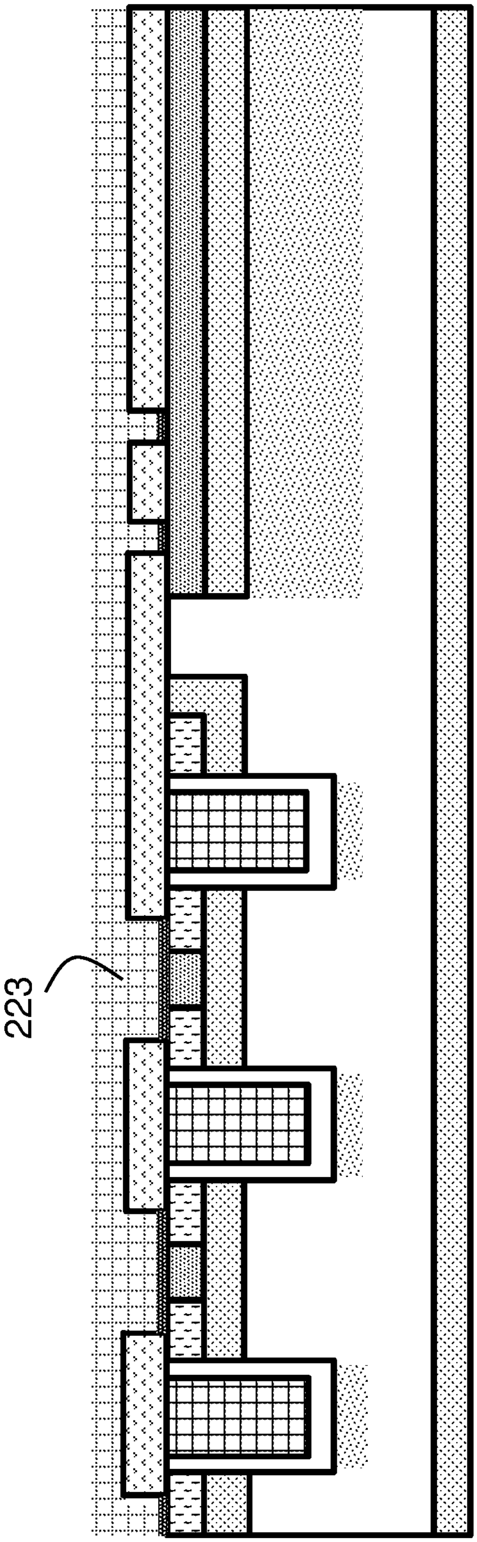
FIG. 11*o* illustrates the step of depositing pad polysilicon by CVD and trimming the polysilicon's resistivity by blanket ion implantation, following the step shown in FIG. 11*n.*
Figure 11P:
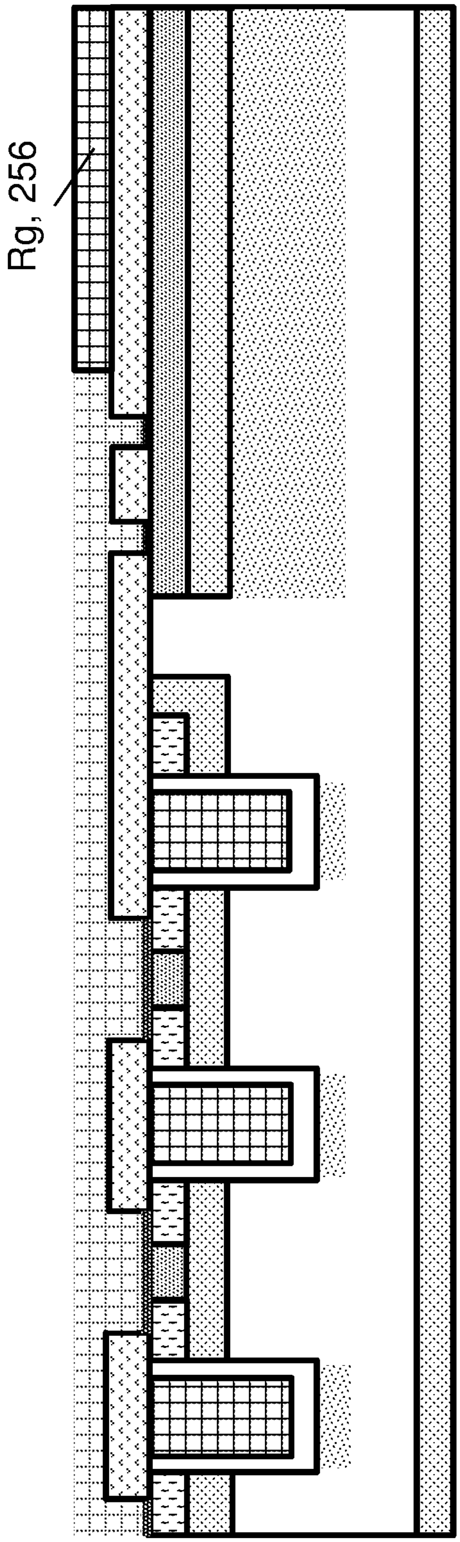
FIG. 11*p* illustrates the step of patterning and implanting to form highly doped gate resistor and gate bus polysilicon, following the step shown in FIG. 11*o.*
Figure 11Q:
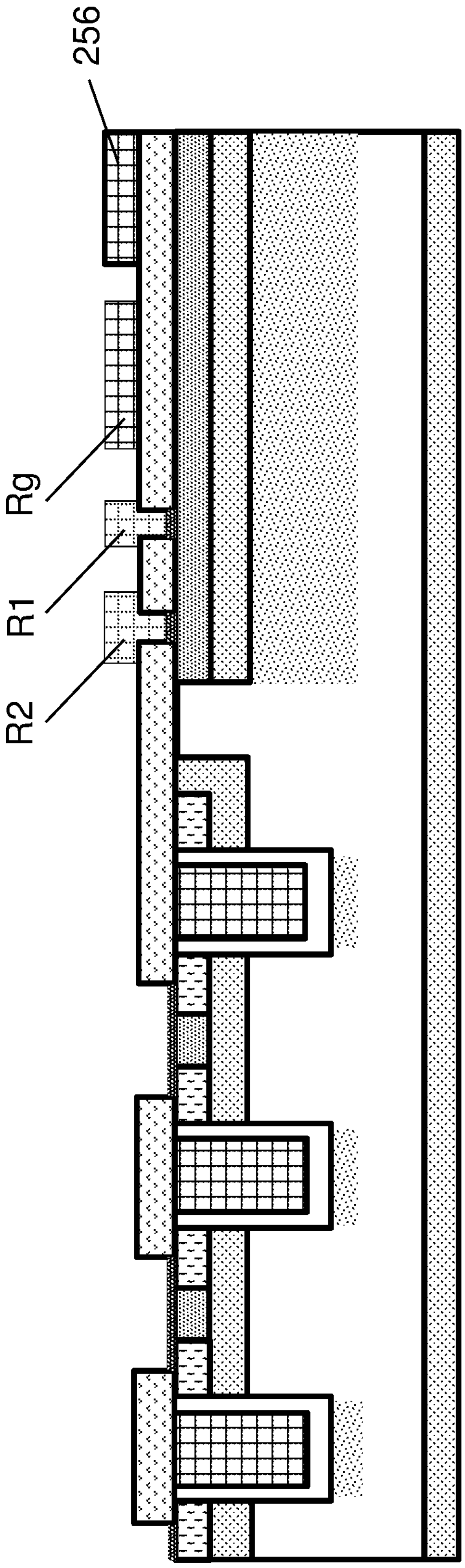
FIG. 11*q* illustrates the step of patterning and etching to separate each polysilicon resistors and gate bus polysilicon, following the step shown in FIG. 11*p.*
Figure 11R:
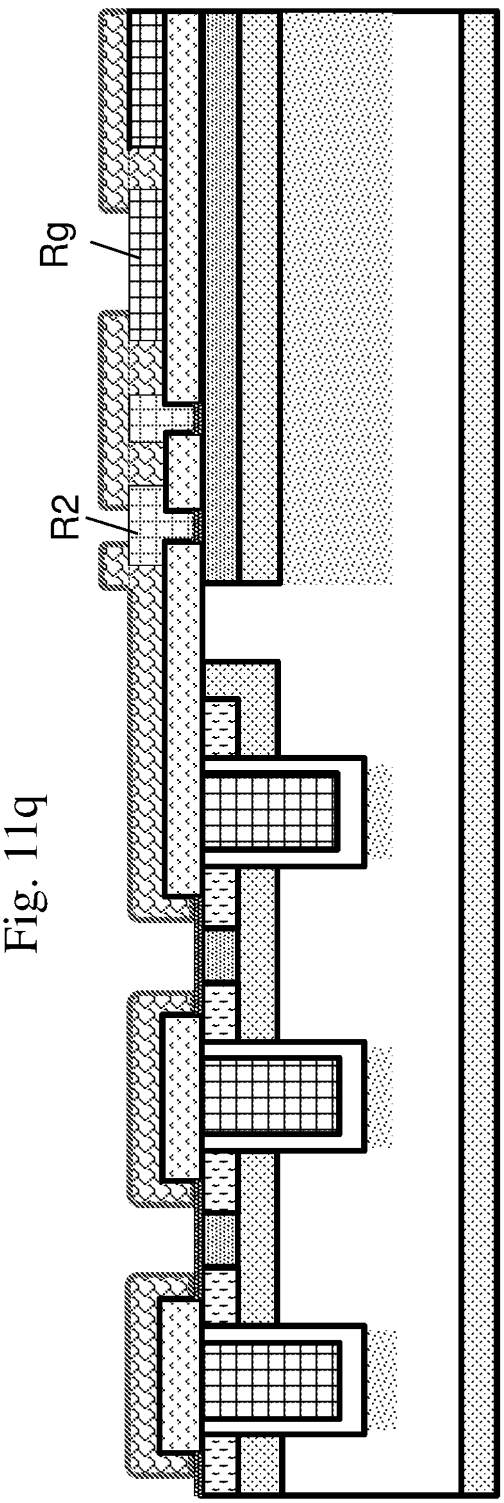
FIG. 11*r* illustrates the step of depositing an ILD layer, patterning and etching the same to form contact areas, following the step shown in FIG. 11*q.*
Figure 11S:
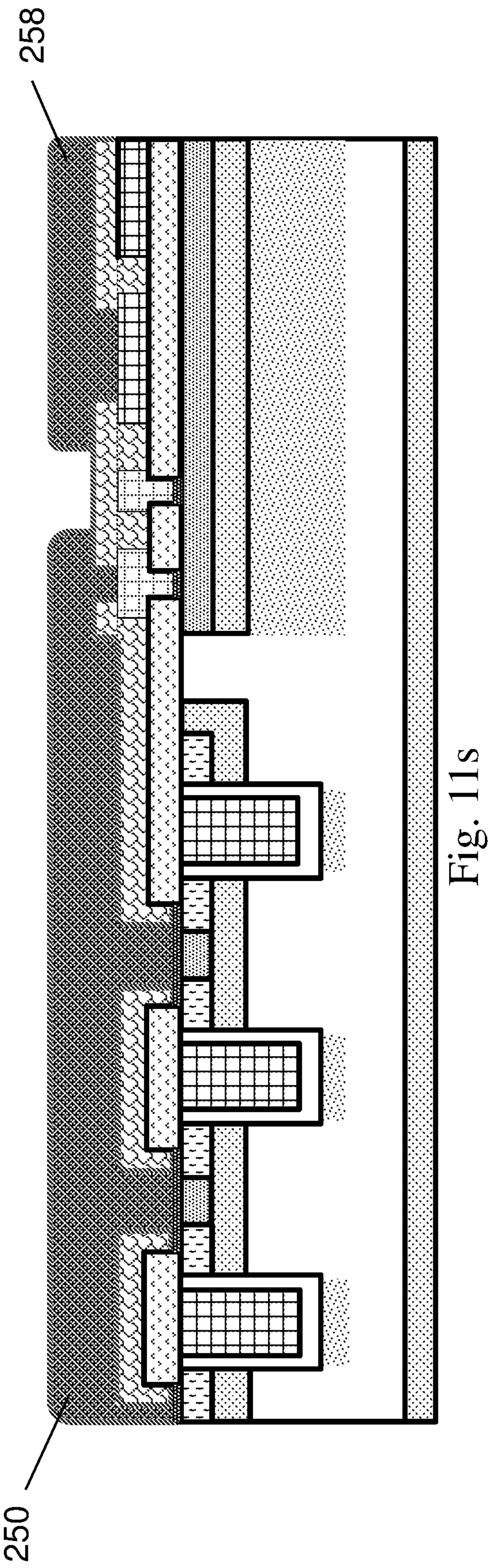
FIG. 11*s* illustrates the step of depositing, patterning and etching front metal to form a source electrode and a gate electrode, following the step shown in FIG. 11*r.*
Figure 11T:
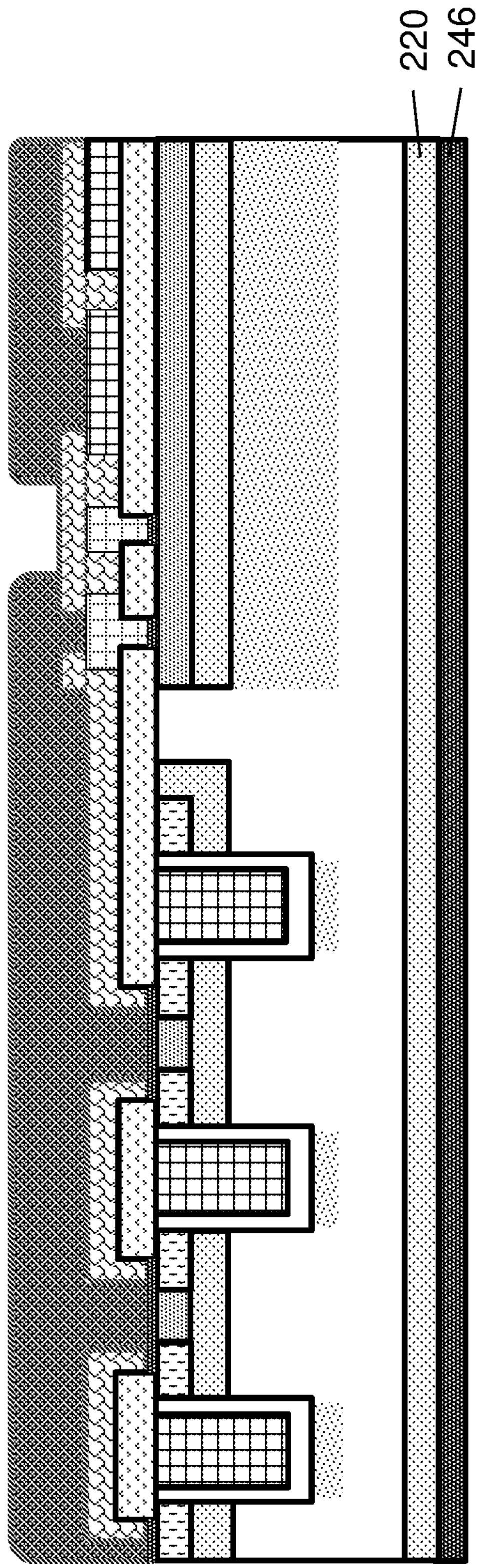
FIG. 11*t* illustrates the step of depositing, annealing back metal to form a drain electrode, following the step shown in FIG. 11*s.*
Figure 12:
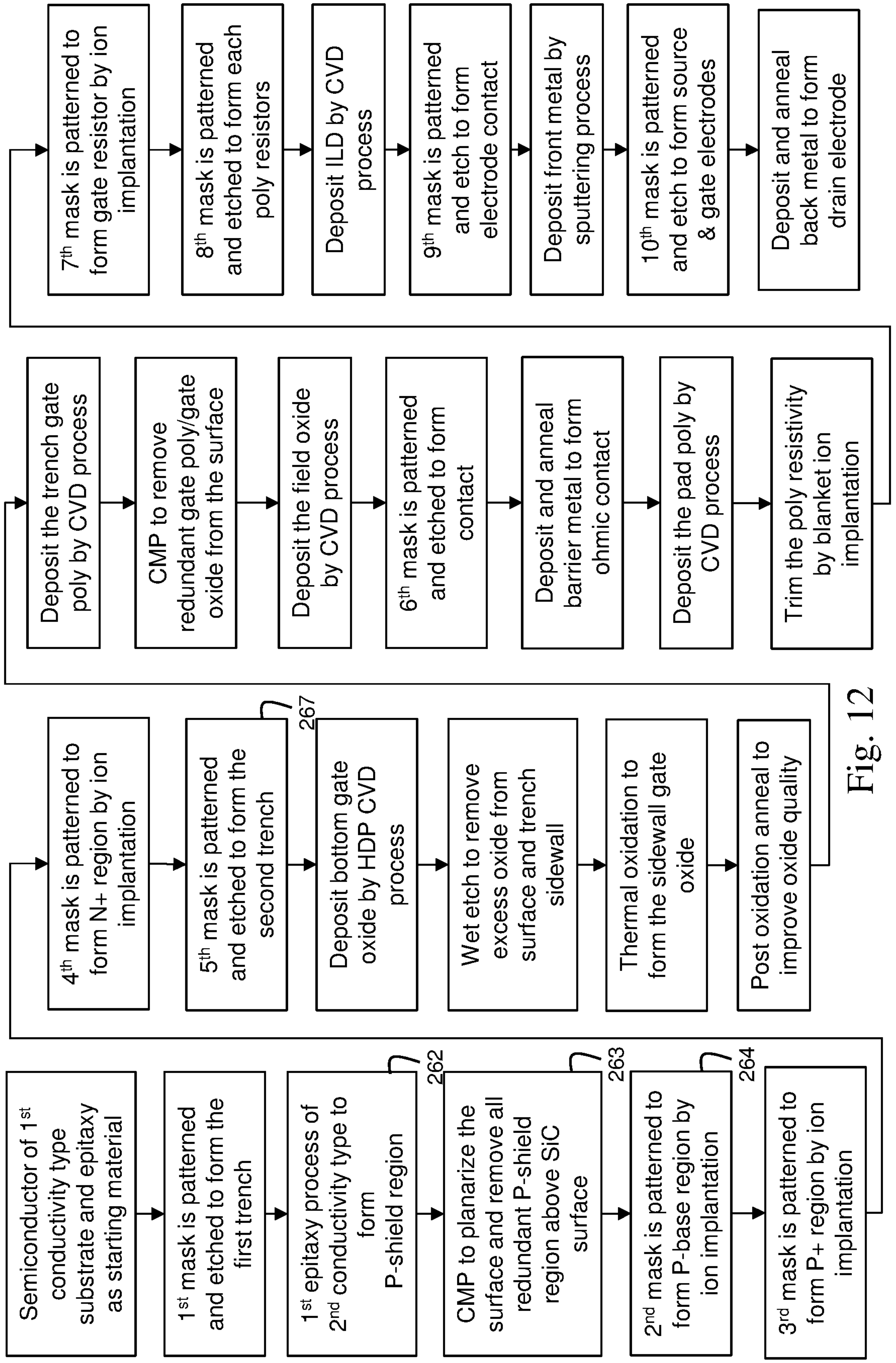
FIG. 12 is a flowchart summarizing the steps of the fabricating method in FIGS. 11*a*-11*t.*

FIGS. 11*a*-12 illustrate another method to manufacture a SiC MOSFET device according to a further embodiment of the invention. Most of the steps in the method are similar to those described above with reference to FIGS. 9*a*-10, and these steps will not be described in detail again for the sake of brevity. Rather, only the differences between the method in FIGS. 11*a*-12 and that in FIGS. 9*a*-10 will be described. In particular, in Step 262 when conducting a first epitaxy process of a second conductivity type to form P− shield regions 224 as shown in FIG. 11*c*, the portion of the P− shield regions 224 above the first silicon carbide layer 222 (see part 224*c*) is redundant and just for planarization purpose. Consequently, in Step 263 all the redundant P− shield portion above the SiC surface is removed by CMP, and the top surfaces of the P− shield regions 224 become flush with the top surfaces of the trenches 221. Thus, unlike the embodiment in FIG. 9*d* where there is a thickness of P− shield region left above the first silicon carbide layer 122, in FIG. 11*d* there is no excess part of the P− shield region above the SiC surface. Moreover, FIG. 11*e* shows patterning using a second mask and ion implantation to form P− base regions of a third silicon carbide layer 226 in Step 264, but what is different in FIG. 11*e* as compared to the embodiment of FIG. 9*e* is that the P− base region 226*c* is continuous in the transistor region that across transistor unit cells, while the P− base regions in the transistor region in FIG. 9*e* are separated from each other. Nonetheless, in Step 267 when the trenches 236 are etched the P− base region 226*c* is still separated to become multiple parts as shown in FIG. 11*g*, similar to the configuration in FIG. 9*g*. Similarly, there is a discontinuity in the third silicon carbide layer 226 between the P− base region 226*c* in transistor region side and the P− base region 226*d* in resistor region side.

Figure 13A:
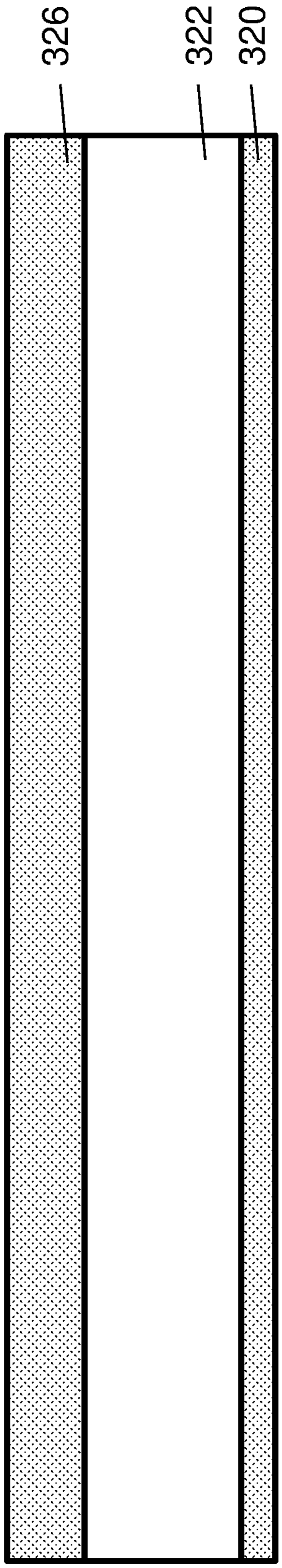
FIG. 13*a* shows a starting material for a method of fabricating the SiC MOSFET device according to a further embodiment of the invention.
Figure 13B:
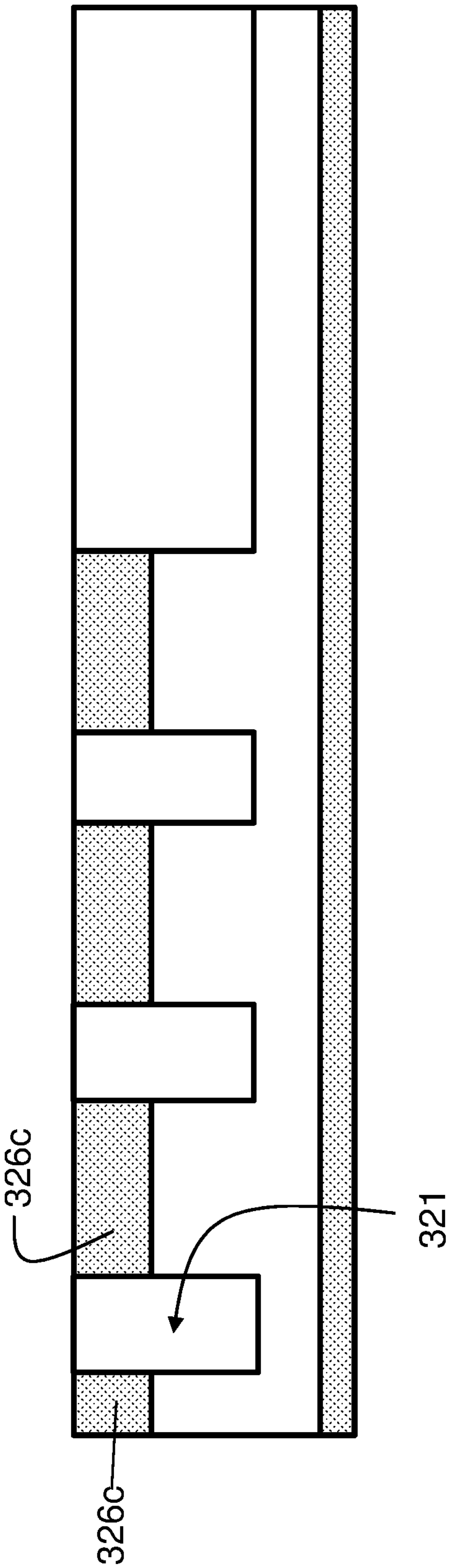
FIG. 13*b* illustrates the step of patterning and etching first trenches from the SiC surface into the N− drift layer of the starting material of FIG. 13*a.*
Figure 13C:
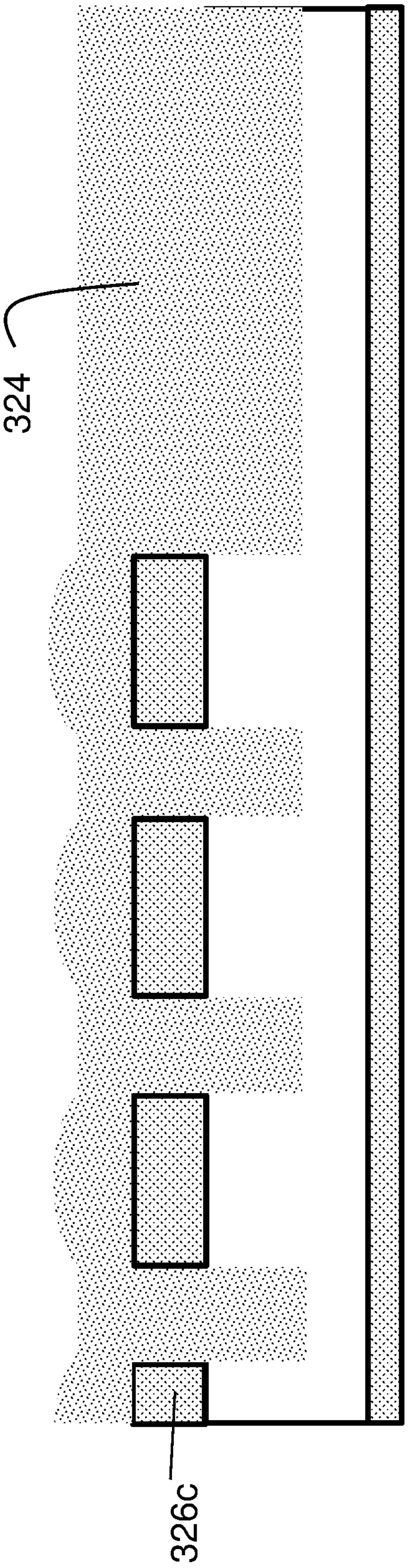
FIG. 13*c* illustrates the step of forming P− shield region by an epitaxy process following the step shown in FIG. 13*b.*
Figure 13D:
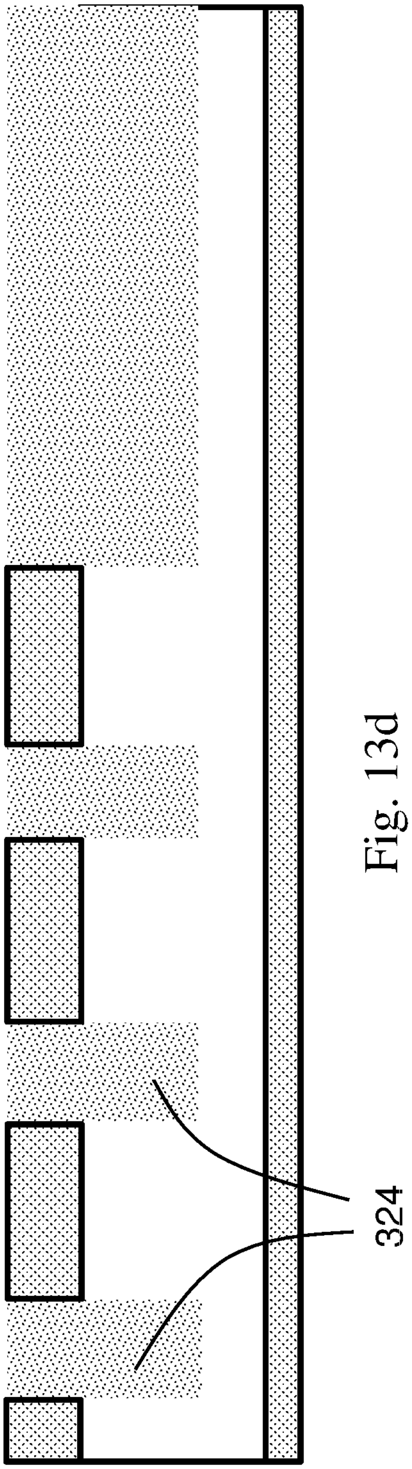
FIG. 13*d* illustrates the step of removing redundant P− shield portion using CMP following the step shown in FIG. 13*c.*
Figure 13E:
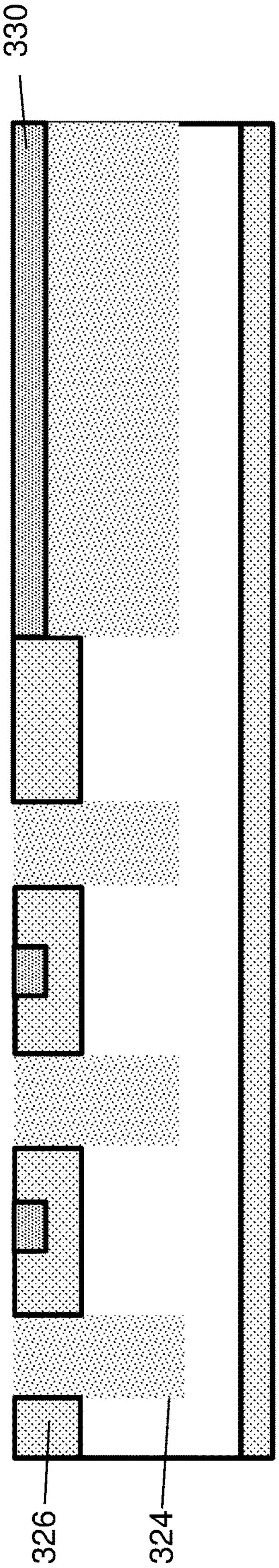
FIG. 13*e* illustrates the step of patterning and implanting P+ regions following the step shown in FIG. 13*d.*
Figure 13F:
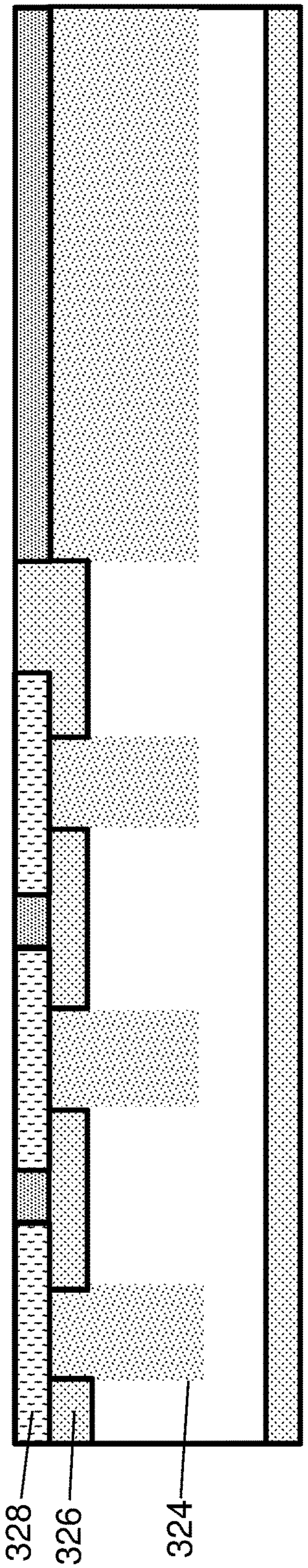
FIG. 13*f* illustrates the step of patterning and implanting N+ regions following the step shown in FIG. 13*e.*
Figure 13G:
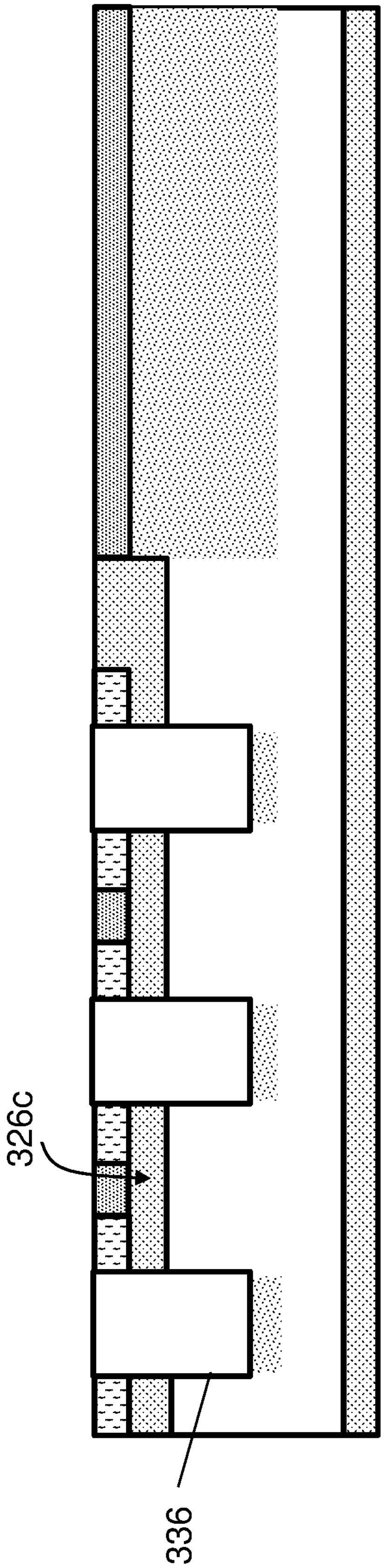
FIG. 13*g* illustrates the step of patterning and etching second trenches following the step shown in FIG. 13*f.*
Figure 13H:
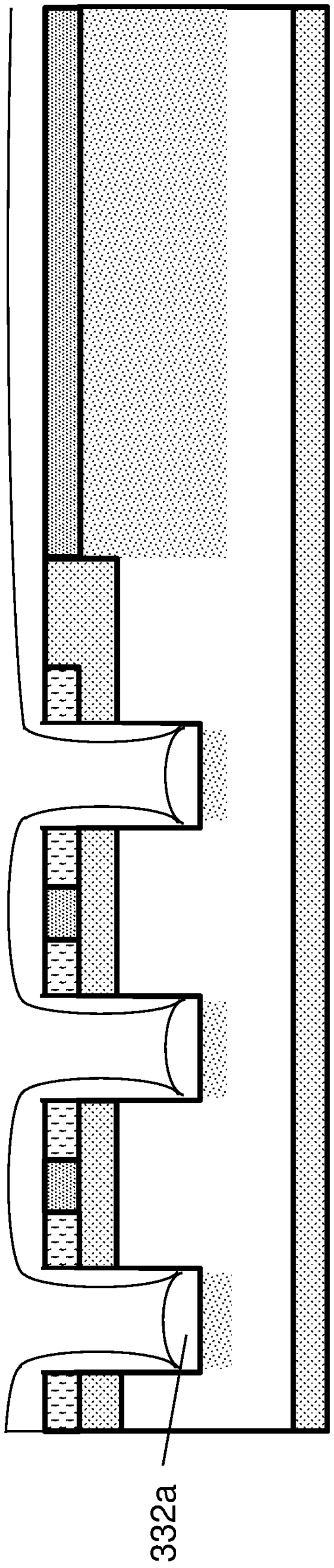
FIG. 13*h* illustrates the step of depositing bottom gate oxide by a Plasma-enhanced chemical vapor deposition (PE-CVD) process, following the step shown in FIG. 13*g.*
Figure 13I:
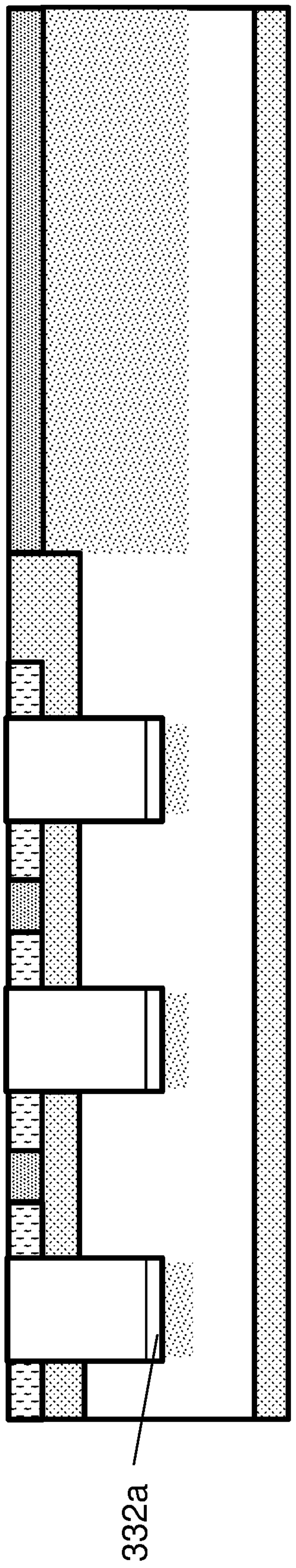
FIG. 13*i* illustrates the step of removing redundant portion of the bottom gate oxide by oxide etching, following the step shown in FIG. 13*h.*
Figure 13J:
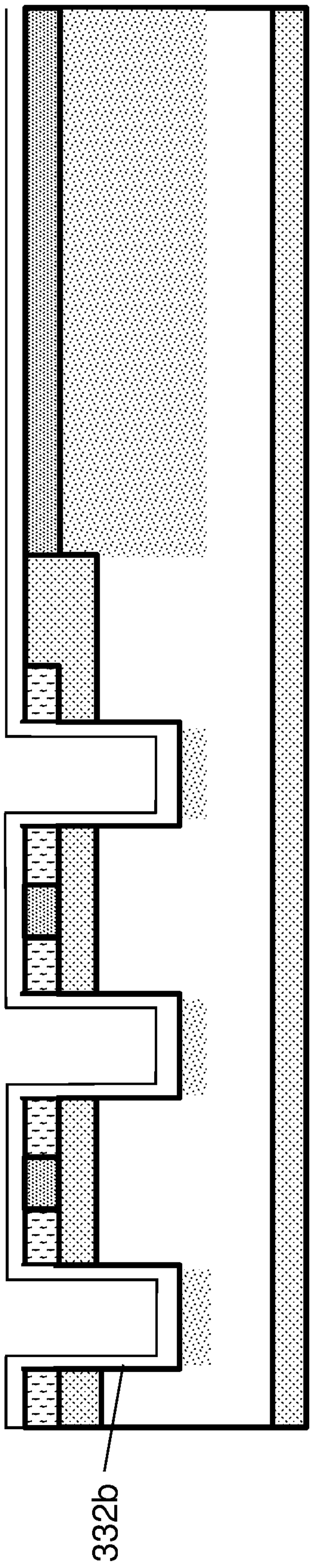
FIG. 13*j* illustrates the step of forming sidewall gate oxide by oxidation process, following the step shown in FIG. 13*i.*
Figure 13K:
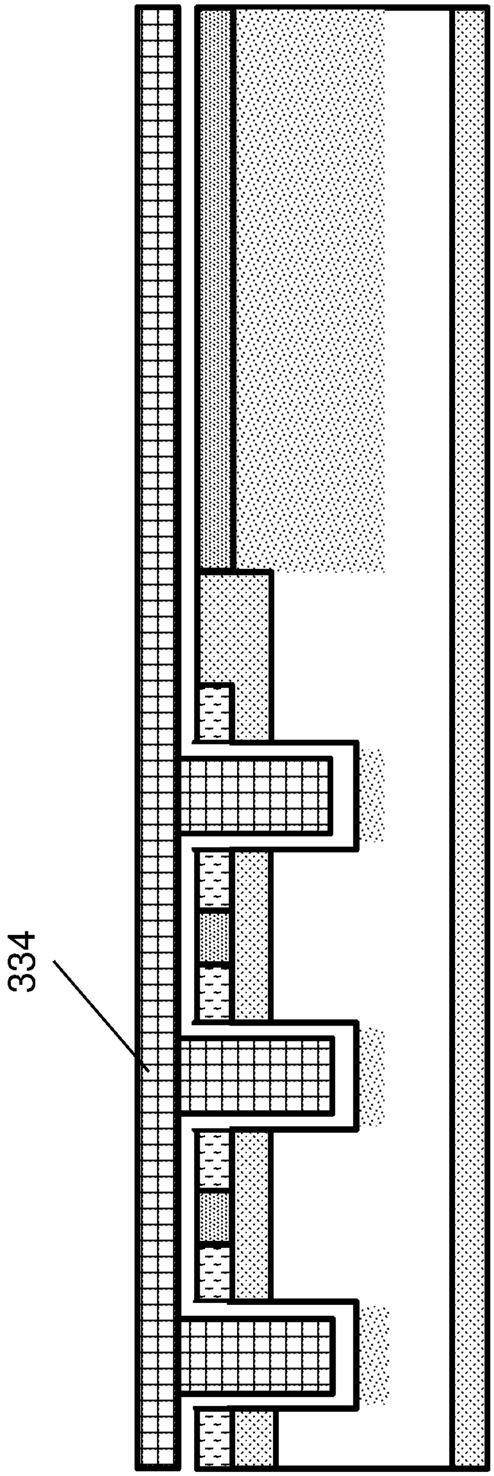
FIG. 13*k* illustrates the step of forming trench gate polysilicon by a CVD process, following the step shown in FIG. 13*j.*
Figure 13L:
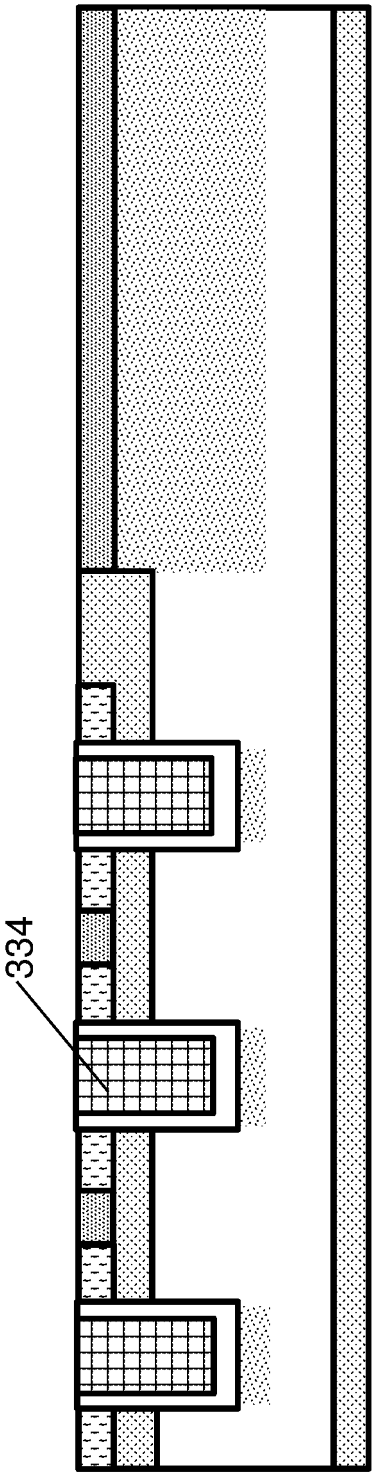
FIG. 13*l* illustrates the step of removing redundant gate polysilicon and gate oxide using CMP, following the step shown in FIG. 13*k*.
Figure 13M:
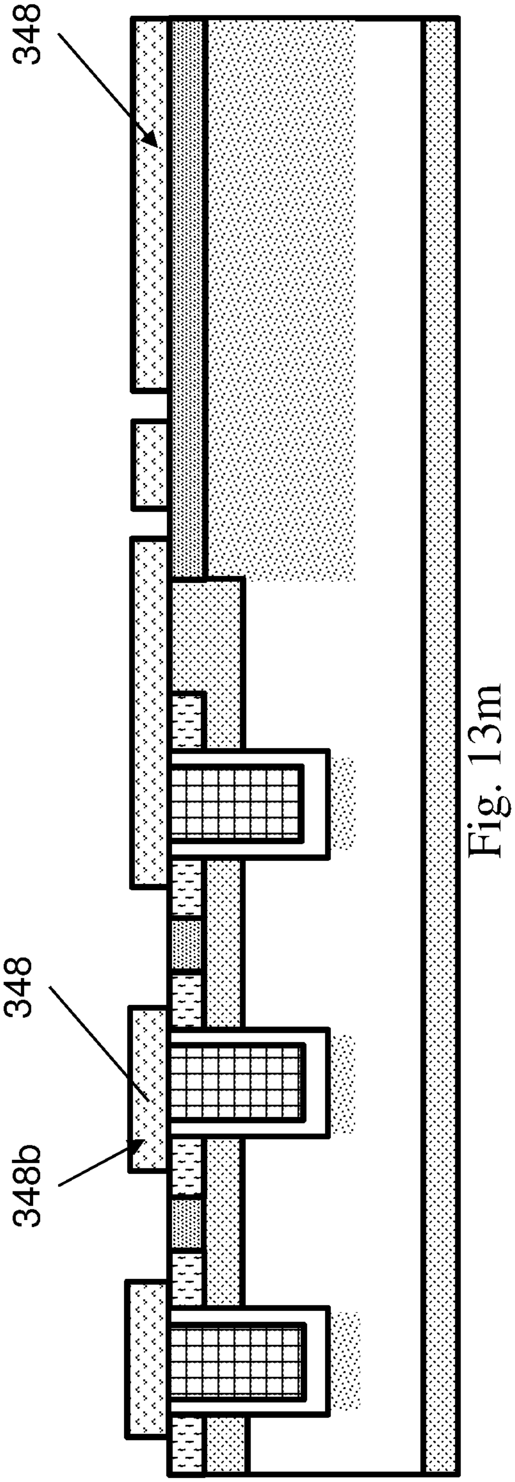
FIG. 13*m* illustrates the step of depositing field oxide by CVD followed by patterning and etching the same to form contact areas, following the step shown in FIG. 13*l*.
Figure 13N:
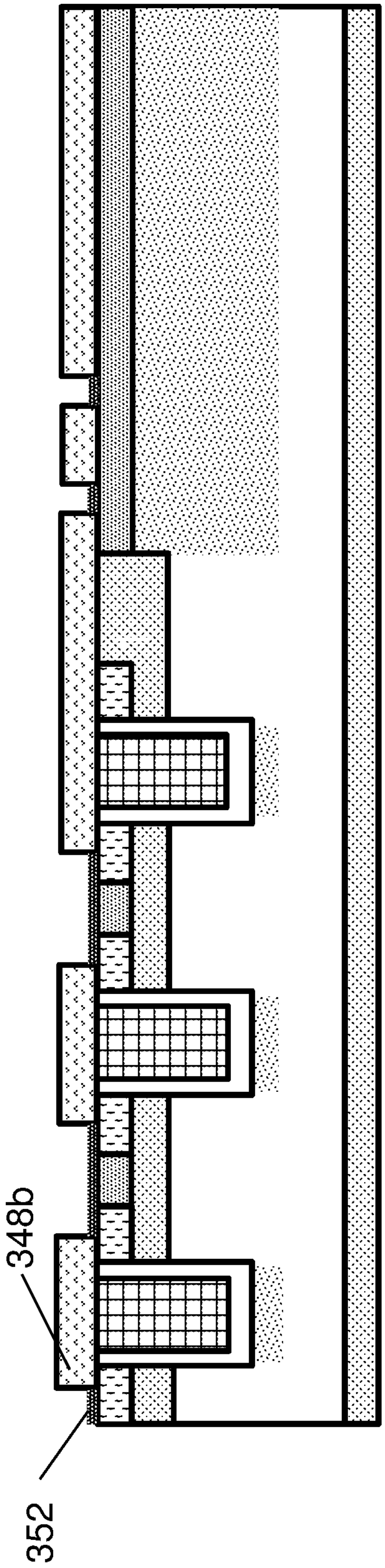
FIG. 13*n* illustrates the step of depositing and annealing barrier metal to form ohmic contacts, following the step shown in FIG. 13*m*.
Figure 13O:
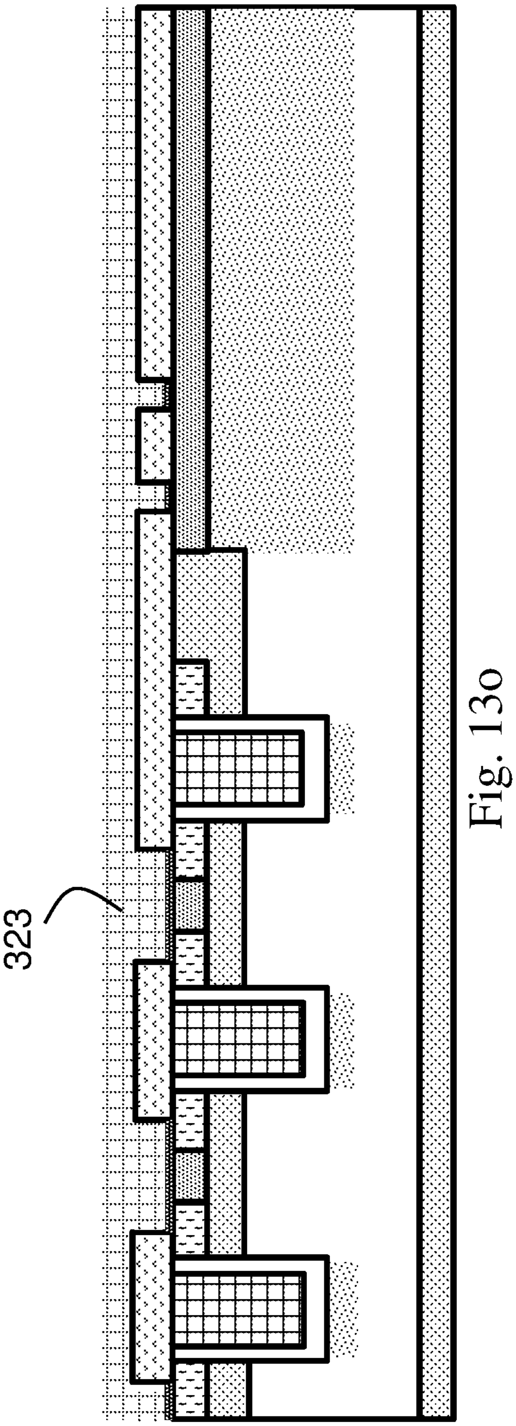
FIG. 13*o* illustrates the step of depositing pad polysilicon by CVD and trimming the polysilicon's resistivity by blanket ion implantation, following the step shown in FIG. 13*n*.
Figure 13P:
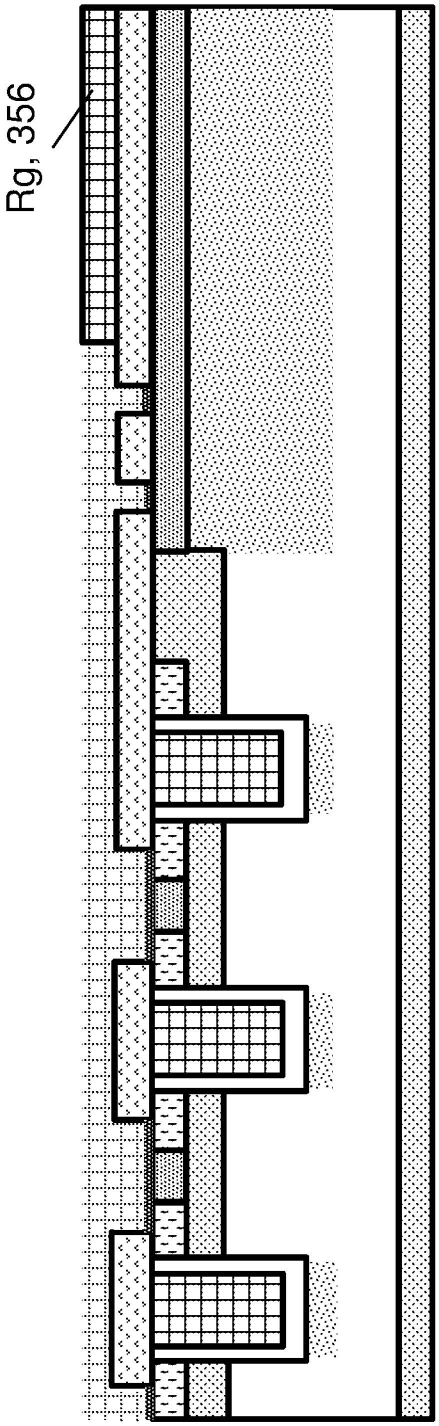
FIG. 13*p* illustrates the step of patterning and implanting to form highly doped gate resistor and gate bus polysilicon, following the step shown in FIG. 13*o*.
Figure 13Q:
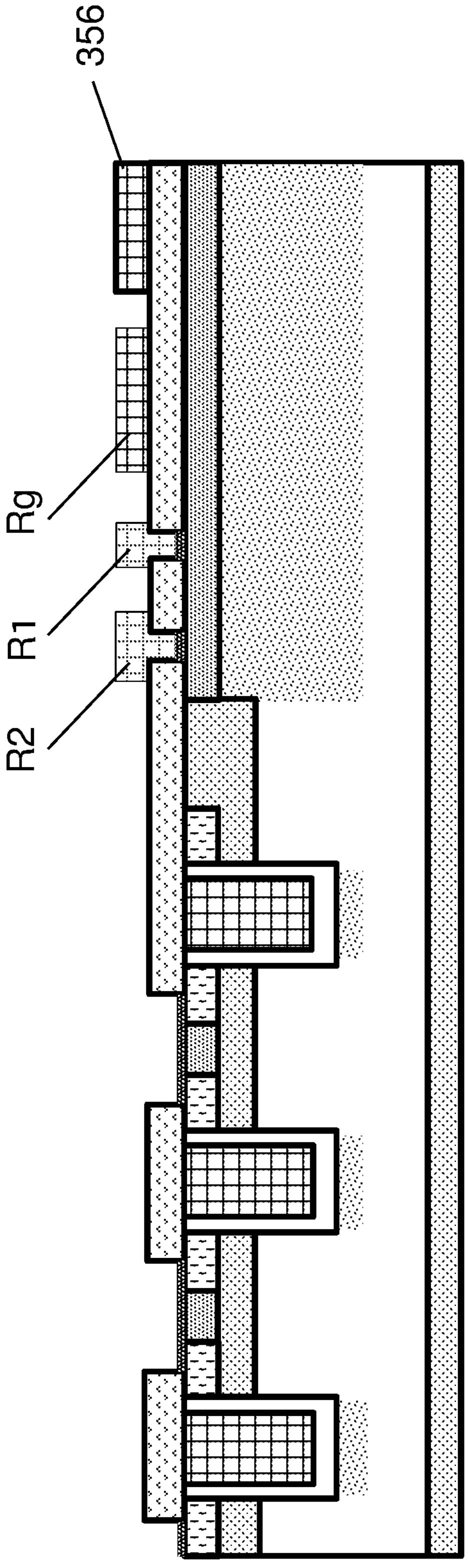
FIG. 13*q* illustrates the step of patterning and etching to separate each polysilicon resistors and gate bus polysilicon, following the step shown in FIG. 13*p*.
Figure 13R:
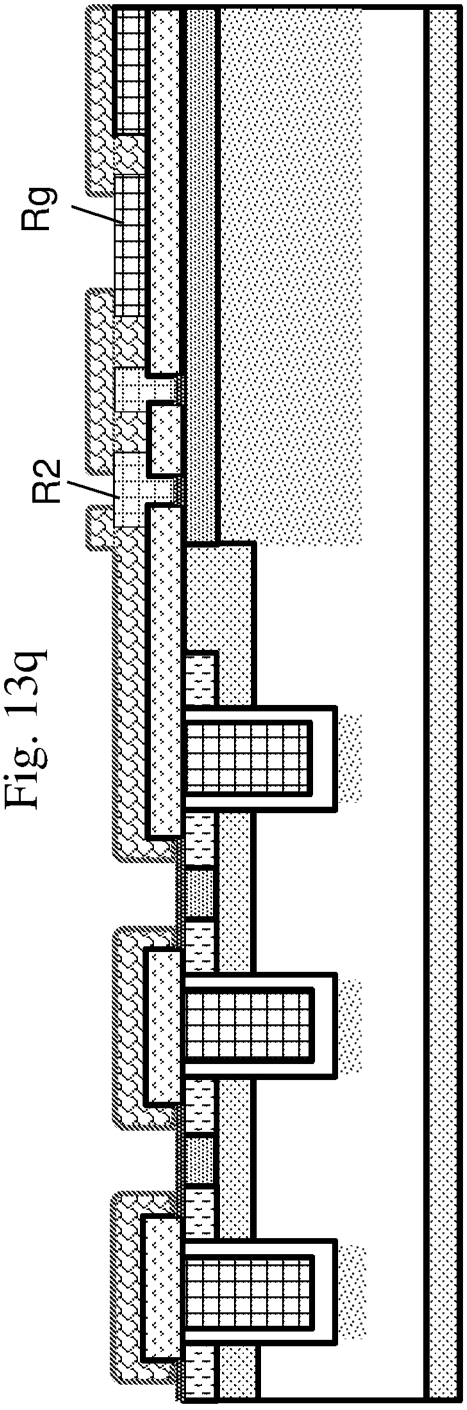
FIG. 13*r* illustrates the step of depositing an ILD layer, patterning and etching the same to form contact areas, following the step shown in FIG. 13*q*.
Figure 13S:
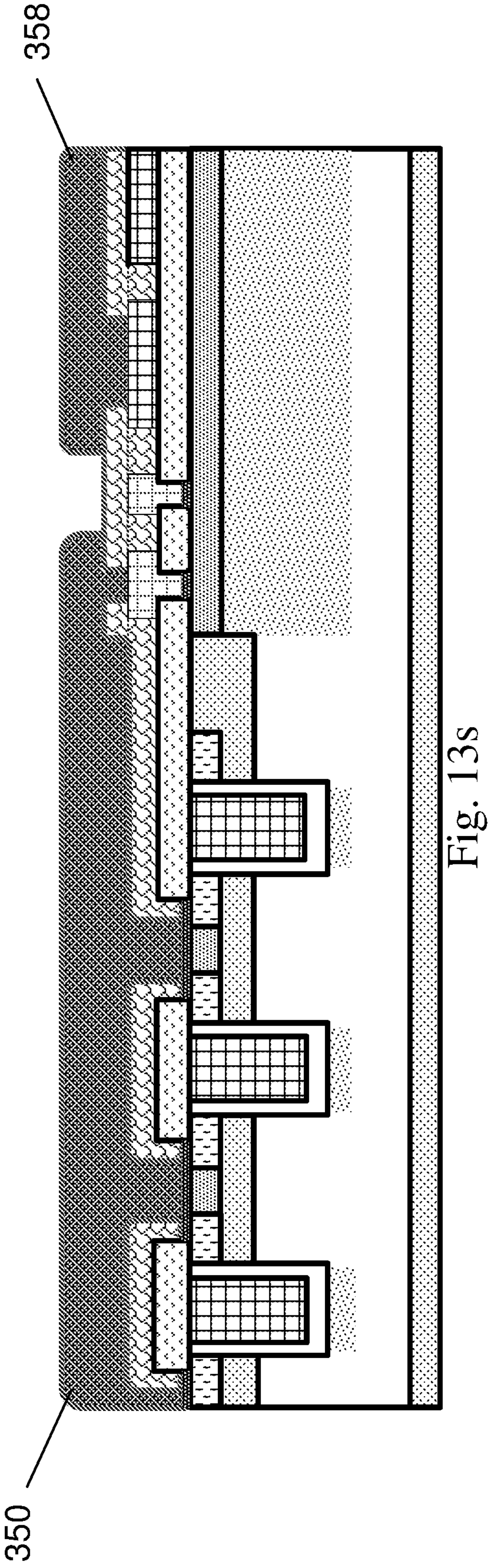
FIG. 13*s* illustrates the step of depositing, patterning and etching front metal to form a source electrode and a gate electrode, following the step shown in FIG. 13*r*.
Figure 13T:
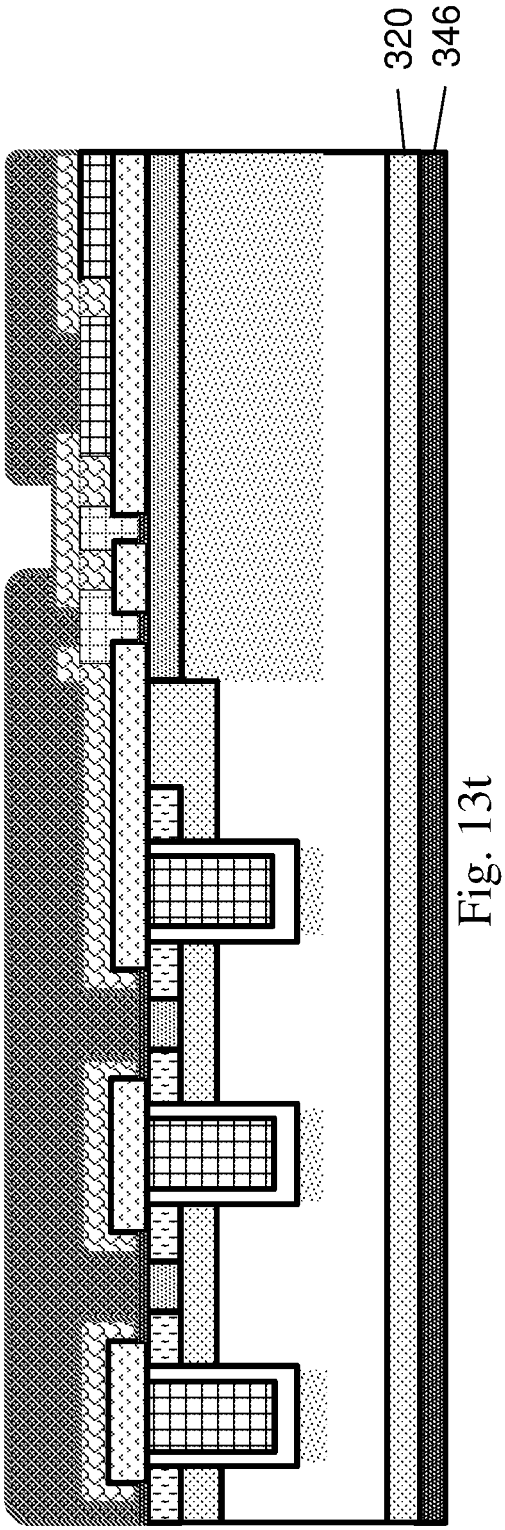
FIG. 13*t* illustrates the step of depositing, annealing back metal to form a drain electrode, following the step shown in FIG. 13*s*.
Figure 14:
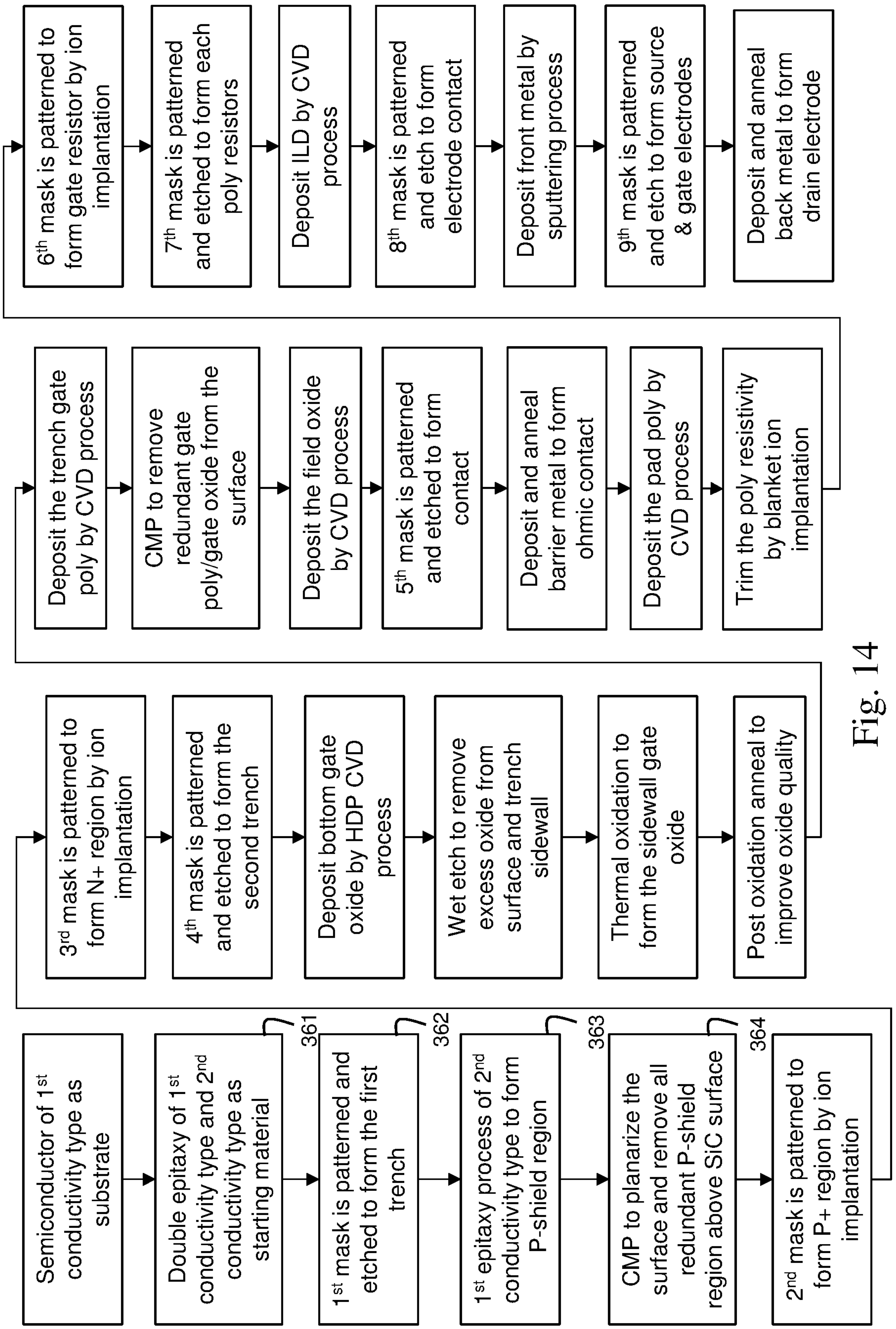
FIG. 14 is a flowchart summarizing the steps of the fabricating method in FIGS. 13*a*-11*t*.

FIGS. 13*a*-14 illustrate another method to manufacture a SiC MOSFET device according to a further embodiment of the invention. Most of the steps in the method are similar to those described above with reference to FIGS. 9*a*-10, and these steps will not be described in detail again for the sake of brevity. Rather, only the differences between the method in FIGS. 13*a*-14 and that in FIGS. 9*a*-10 will be described. In particular, the starting material as shown in FIG. 13*a* is different from that shown in FIG. 9*a*, in that the silicon carbide epi wafer contains not only a silicon carbide substrate 320 of N+ type, a first silicon carbide layer 322 on top thereof which is of N− type, but also a P− base layer 326 on top of the first silicon carbide layer 322. It can be realized by a double epitaxy material in Step 361. As the P− base layer 326 is provided in the starting material, there is no need for patterning and ion implantation to generate the P− base regions in later steps. In the next step of forming the first trenches 321, which is Step 362, the P− base layer 326 is also etched along with the first silicon carbide layer 322 as shown in FIG. 13*b*, forming multiple P− base regions 326*c*. In Step 363 where the first epitaxy process is carried out to form the P− shield layer 324, the existing P− base regions 326*c* are also not affected as shown in FIG. 13*c*. As shown in FIG. 13*d*, all the redundant P− shield portion above the SiC surface is removed by CMP in Step 364, and the top surfaces of the P− shield regions 324 become flush with the top surfaces of the trenches 321. Thus, it is unlike the embodiment in FIG. 9*d* where there is a thickness of P− shield region left above the first silicon carbide layer 122.

The exemplary embodiments of the present invention are thus fully described. Although the description referred to particular embodiments, it will be clear to one skilled in the art that the present invention may be practiced with variation of these specific details. Hence this invention should not be construed as limited to the embodiments set forth herein.

While the invention has been illustrated and described in detail in the drawings and foregoing description, the same is to be considered as illustrative and not restrictive in character, it being understood that only exemplary embodiments have been shown and described and do not limit the scope of the invention in any manner. It can be appreciated that any of the features described herein may be used with any embodiment. The illustrative embodiments are not exclusive of each other or of other embodiments not recited herein. Accordingly, the invention also provides embodiments that comprise combinations of one or more of the illustrative embodiments described above. Modifications and variations of the invention as herein set forth can be made without departing from the spirit and scope thereof, and, therefore, only such limitations should be imposed as are indicated by the appended claims.

In the embodiments depicted in FIGS. 4*a*-5*b*, specific gate voltages such as 0-15V and 0-2.5V, as well as specific resistor values are mentioned. Those skilled in the art should understand that this invention is not limited to any specific gate voltage, resistor value, or voltage divider ratio. Rather, it is the layout of the circuit and the structure of the SiC MOSFET device that mark a unique characteristic of embodiments of the invention.

Similarly, in the exemplary embodiments, different materials are described for manufacturing the electrodes, for the masks, or for the dopants. In addition, different thicknesses and doping concentration are discussed. Those skilled in the art should understand all these specific parameters and choices should not considered as limiting the invention. Rather, different materials and/or different parameters may be adopted by skilled persons according to different practical applications, without departing from the spirit of the invention. For example, for making the electrodes, there are many conductive materials that can be chosen for example Titanium (Ti), Nickel (Ni), Titanium nitride (TiN), Titanium aluminum (TiAl), Platinum (Pt), Aluminum (Al) and the like.

What is claimed is:

1. A silicon carbide MOSFET device, comprising:

a) a silicon carbide substrate of a first dopant type;

b) a first silicon carbide layer of the first dopant type on top of the silicon carbide substrate;

c) a plurality of trenches partially formed in the first silicon carbide layer; each of the plurality of trenches covered at its exterior with a gate oxide;

d) a second silicon carbide layer of a second dopant type embedded in the first silicon carbide layer; the second silicon carbide layer comprising a plurality of second portions;

e) a third silicon carbide layer of the second dopant type located above at least part of the second silicon carbide layer; and f) a fourth silicon carbide layer located above at least part of the third silicon carbide layer;

wherein the gate oxide of each of the plurality of trenches comprises a bottom surface and a side surface; a corresponding one of the plurality of second portions located directly underneath the bottom surface of the gate oxide of each of the plurality of trenches;

wherein the silicon carbide MOSFET device further comprises a plurality of resistors that are formed monolithically with the silicon carbide substrate and the first to fourth silicon carbide layers; the plurality of resistors comprising a first resistor and a second resistor; the first resistor and the second resistor both connected to the plurality of second portions; the first resistor being electrically connected to a source electrode of the silicon carbide MOSFET device.

2. The silicon carbide MOSFET device according to claim 1, wherein the first dopant type is N and the second dopant type is P; the second and third silicon carbide layers being P− layers; the fourth silicon carbide layer comprising P+ and N+ regions.

3. The silicon carbide MOSFET device according to claim 1, wherein the corresponding one of the plurality of second portions does not cover the side surface of the gate oxide of each of the plurality of trenches.

4. The silicon carbide MOSFET device according to claim 1, wherein the plurality of resistors is offset from the plurality of trenches along a horizontal direction.

5. The silicon carbide MOSFET device according to claim 4, wherein the plurality of resistors is located above the fourth silicon carbide layer.

6. The silicon carbide MOSFET device according to claim 1, wherein the first and second resistors constitute a voltage divider.

7. The silicon carbide MOSFET device according to claim 1, wherein the plurality of resistors comprises a third resistor; the third resistor connecting a polysilicon material in each of the plurality of the trenches to a gate electrode of the silicon carbide MOSFET device.

8. The silicon carbide MOSFET device according to claim 7, wherein the gate electrode is offset horizontally from a source electrode of the silicon carbide MOSFET device.

9. The silicon carbide MOSFET device according to claim 1, further comprises a field oxide layer on top of the fourth silicon carbide layer; the field oxide layer comprising a plurality of oxide portions each formed above and corresponding to one of the plurality of trenches.

10. The silicon carbide MOSFET device according to claim 9, further comprises a dielectric layer substantially on top of the field oxide layer; the dielectric layer comprising a plurality of dielectric insulating portions each formed above and corresponding to one of the oxide portions.

11. The silicon carbide MOSFET device of claim 1, produced by a method comprising:

a) providing the first silicon carbide layer of the first dopant type on top of the silicon carbide substrate;

b) forming the plurality of trenches which are partially embedded in the first silicon carbide layer and covering each of the plurality of trenches with a gate oxide;

c) providing the second silicon carbide layer of the second dopant type embedded in the first silicon carbide layer, the second silicon carbide layer comprising the plurality of second portions;

d) providing the third silicon carbide layer of the second dopant type located above at least part of the second silicon carbide layer;

e) providing the fourth silicon carbide layer above at least part of the third silicon carbide layer; and f) forming the plurality of resistors monolithically with the silicon carbide substrate and the first to fourth silicon carbide layers.

12. A method of producing a silicon carbide MOSFET device, comprising the steps of:

a) providing a first silicon carbide layer of a first dopant type on top of a silicon carbide substrate of the first dopant type;

b) forming a plurality of trenches partially embedded in the first silicon carbide layer; each of the plurality of trenches covered with a gate oxide;

c) providing a second silicon carbide layer of a second dopant type embedded in the first silicon carbide layer; the second silicon carbide layer comprising a plurality of second portions;

d) providing a third silicon carbide layer of the second dopant type located above at least part of the second silicon carbide layer;

e) providing a fourth silicon carbide layer located above at least part of the third silicon carbide layer; and f) forming a plurality of resistors monolithically with the silicon carbide substrate and the first to fourth silicon carbide layers; wherein the plurality of resistors comprises a first resistor and a second resistor; the first resistor and the second resistor both connected to the plurality of second portions; the first resistor being electrically connected to a source electrode of the silicon carbide MOSFET device;

wherein the gate oxide of each of the plurality of trenches comprises a bottom surface and a side surface; a corresponding one of the plurality of second portions located directly underneath the bottom surface of the gate oxide of each of the plurality of trenches.

13. The method according to claim 12, wherein the first dopant type is N and the second dopant type is P; the second and third silicon carbide layers being P− layers; the fourth silicon carbide layer comprising P+ regions and N+ regions.

14. The method according to claim 12, wherein step c) further comprises the steps of:

g) forming a plurality of first trenches in the first silicon carbide layer;

h) performing epitaxy of the second dopant type over the first silicon carbide layer including the plurality of first trenches to form the second silicon carbide layer;

i) patterning and etching the second silicon carbide layer at predetermined positions to form the plurality of second portions.

15. The method according to claim 12, wherein step f) further comprises the steps of:

j) providing a polysilicon layer over the fourth silicon carbide layer;

k) implanting the polysilicon layer with the first dopant type to trim the resistivity of resistors;

l) patterning and etching the polysilicon layer to form a first resistor and a second resistor.

16. The method according to claim 15, wherein the first and second resistors constitute a voltage divider.

* * * * *